US007589032B2

(12) United States Patent
Yamazaki et al.

(10) Patent No.: US 7,589,032 B2
(45) Date of Patent: Sep. 15, 2009

(54) LASER APPARATUS, LASER IRRADIATION METHOD, SEMICONDUCTOR MANUFACTURING METHOD, SEMICONDUCTOR DEVICE, AND ELECTRONIC EQUIPMENT

(75) Inventors: Shunpei Yamazaki, Tokyo (JP); Koichiro Tanaka, Kanagawa (JP); Hidekazu Miyairi, Kanagawa (JP); Aiko Shiga, Kanagawa (JP); Akihisa Shimomura, Kanagawa (JP); Mai Akiba, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 568 days.

(21) Appl. No.: 10/237,172

(22) Filed: Sep. 9, 2002

(65) Prior Publication Data
US 2003/0089690 A1    May 15, 2003

(30) Foreign Application Priority Data
Sep. 10, 2001    (JP)    ............................. 2001-273712

(51) Int. Cl.
*H01L 21/26* (2006.01)
(52) U.S. Cl. .................... 438/795; 438/487; 438/973; 257/E21.328
(58) Field of Classification Search ................ 438/149, 438/311, 378, 479, 482, 486–488, 795, 973, 438/166; 257/E21.328
See application file for complete search history.

(56) References Cited

U.S. PATENT DOCUMENTS

| 3,786,224 | A |   | 1/1974 | Heywang et al. |
| 4,910,549 | A | * | 3/1990 | Sugita ........................ 355/53 |
| 5,010,230 | A |   | 4/1991 | Uemura |
| 5,138,131 | A |   | 8/1992 | Nishikawa et al. |
| 5,227,607 | A |   | 7/1993 | Ishiyama |
| 5,372,836 | A |   | 12/1994 | Imahashi et al. |
| 5,525,807 | A |   | 6/1996 | Hirokawa et al. |
| 5,571,430 | A |   | 11/1996 | Kawasaki et al. |
| 5,608,223 | A |   | 3/1997 | Hirokawa et al. |
| RE36,113  | E |   | 2/1999 | Brueck et al. |

(Continued)

FOREIGN PATENT DOCUMENTS

JP    55-150238    11/1980

(Continued)

OTHER PUBLICATIONS

U.S. Appl. No. 10/235,942, filed Sep. 6, 2002, is being related information for the attached application being filed.

(Continued)

*Primary Examiner*—Charles D. Garber
*Assistant Examiner*—Stanetta D Isaac
(74) *Attorney, Agent, or Firm*—Nixon Peabody LLP; Jeffrey L. Costellia

(57) ABSTRACT

Continuous wave laser apparatus with enhanced processing efficiency is provided as well as a method of manufacturing a semiconductor device using the laser apparatus. The laser apparatus has: a laser oscillator; a unit for rotating a process object; a unit for moving the center of the rotation along a straight line; and an optical system for processing laser light that is outputted from the laser oscillator to irradiate with the laser light a certain region within the moving range of the process object. The laser apparatus is characterized in that the certain region is on a line extended from the straight line and that the position at which the certain region overlaps the process object is moved by rotating the process object while moving the center of the rotation along the straight line.

10 Claims, 26 Drawing Sheets

U.S. PATENT DOCUMENTS

| | | | |
|---|---|---|---|
| 5,872,365 A * | 2/1999 | Goh et al. | 250/492.1 |
| 5,903,324 A * | 5/1999 | Lyons et al. | 375/240.26 |
| 5,948,288 A | 9/1999 | Treves et al. | |
| 6,096,581 A | 8/2000 | Zhang et al. | |
| 6,160,615 A * | 12/2000 | Matsui et al. | 356/237.4 |
| 6,204,519 B1 | 3/2001 | Yamazaki et al. | 257/72 |
| 6,458,635 B2 | 10/2002 | Yamazaki et al. | 438/149 |
| 6,509,212 B1 | 1/2003 | Zhang et al. | 438/149 |
| 6,700,096 B2 | 3/2004 | Yamazaki et al. | |
| 6,723,590 B1 | 4/2004 | Zhang et al. | 438/166 |
| 6,844,523 B2 * | 1/2005 | Yamazaki et al. | 219/121.66 |
| 2002/0009839 A1 | 1/2002 | Zhang et al. | |
| 2002/0058366 A1 | 5/2002 | Miyasaki et al. | |
| 2002/0094008 A1 | 7/2002 | Tanaka | |
| 2003/0059991 A1 | 3/2003 | Teramoto et al. | |
| 2003/0080100 A1 | 5/2003 | Yamazaki et al. | |
| 2004/0198072 A1 | 10/2004 | Zhang et al. | |

FOREIGN PATENT DOCUMENTS

| | | |
|---|---|---|
| JP | 61-080814 | 4/1986 |
| JP | 61-179524 | 8/1986 |
| JP | 63-005514 | 1/1988 |
| JP | 64-082636 | 3/1989 |
| JP | 05-275336 | 10/1993 |
| JP | 07-335585 | 12/1995 |
| JP | 2003-332258 | 11/2003 |

OTHER PUBLICATIONS

Office Action, U.S. Appl. No. 11/812,557, mailed Dec. 16, 2008.

* cited by examiner

FIG. 3A
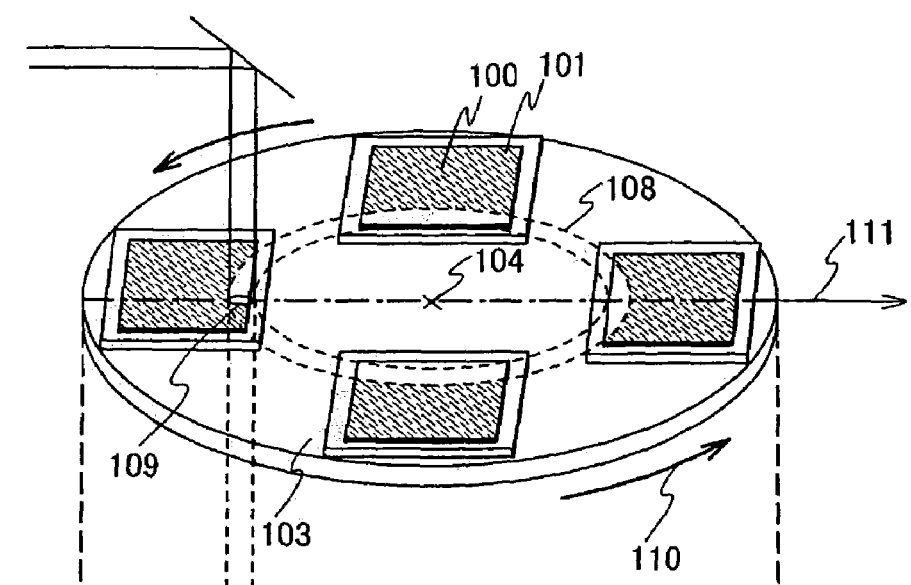
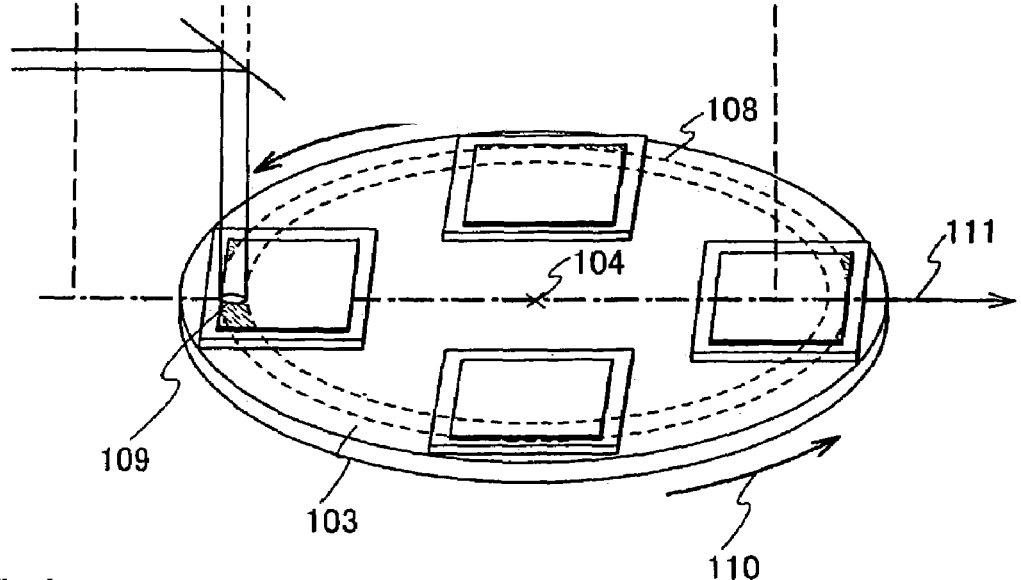
FIG. 3B

100

FIG. 8A
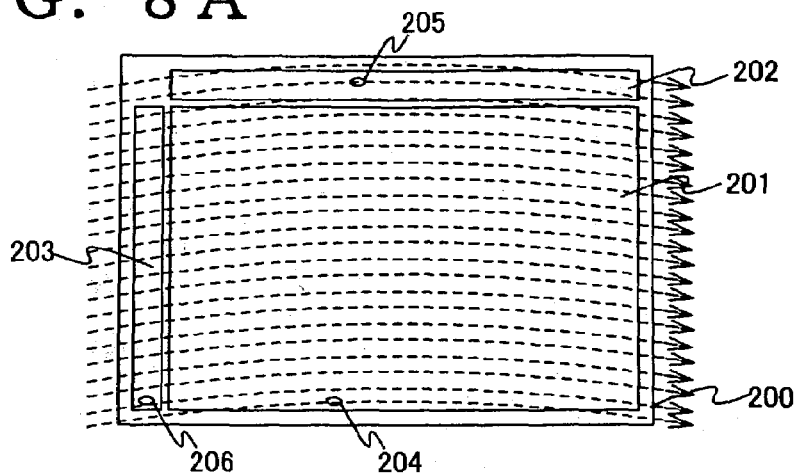
FIG. 8B
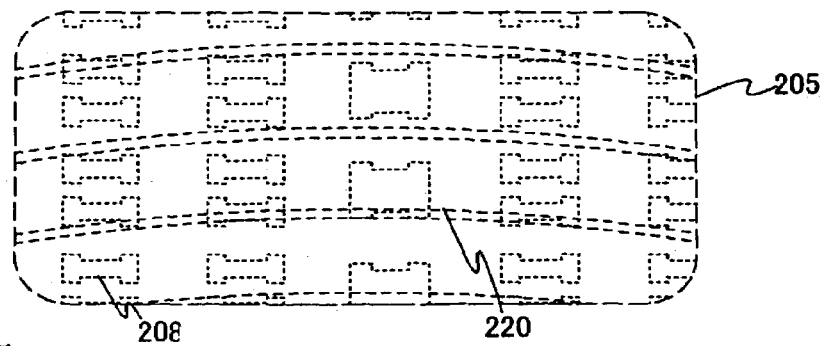
FIG. 8C
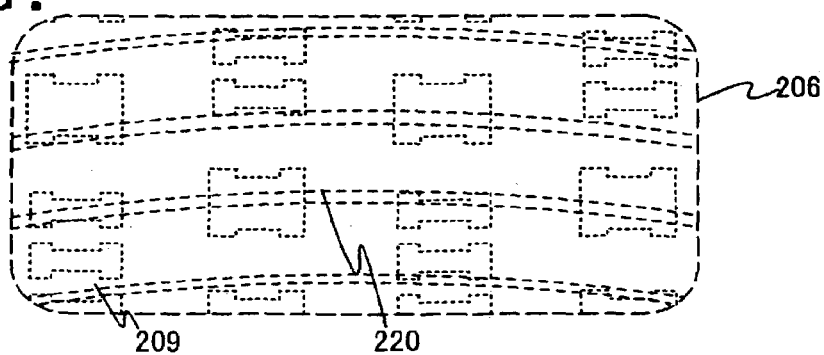
FIG. 8D 453
450
452
451

450
θ1
θ2

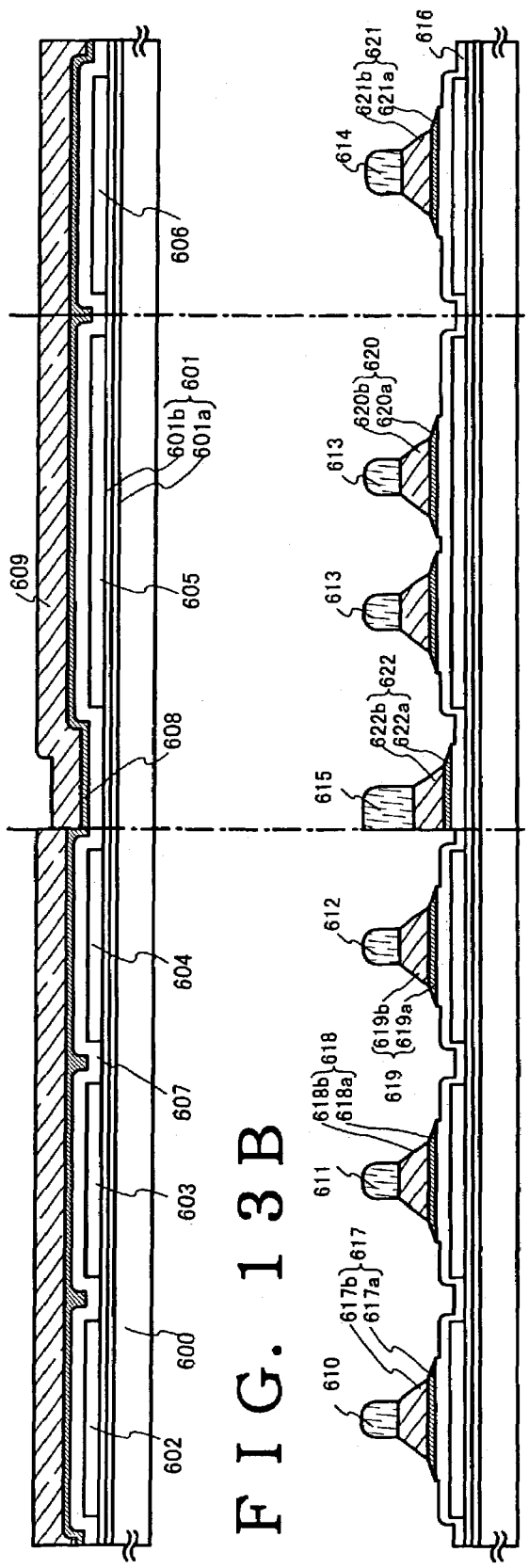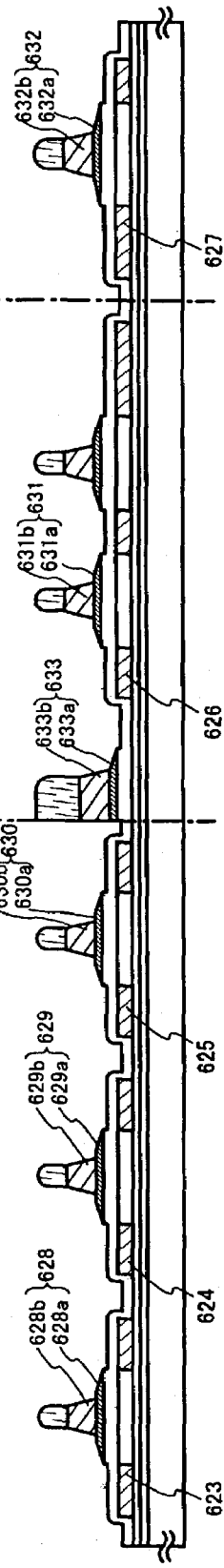
FIG. 13A
FIG. 13B
FIG. 13C

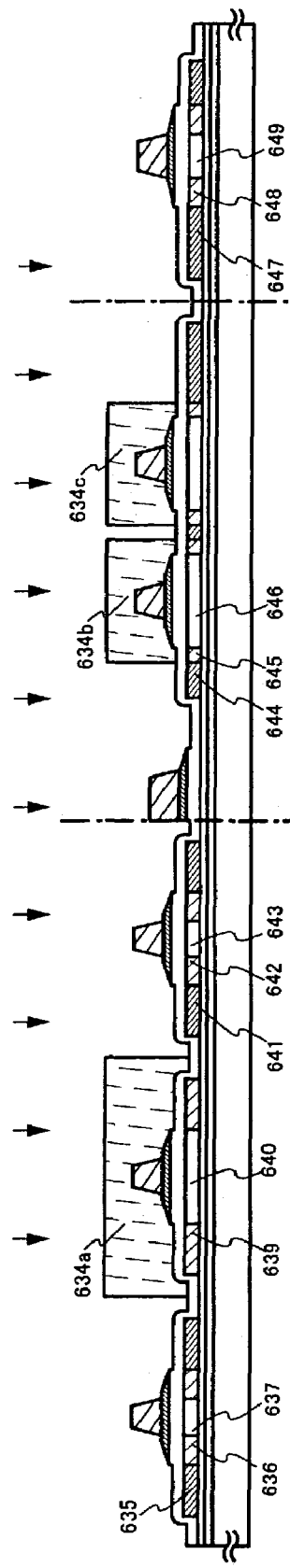
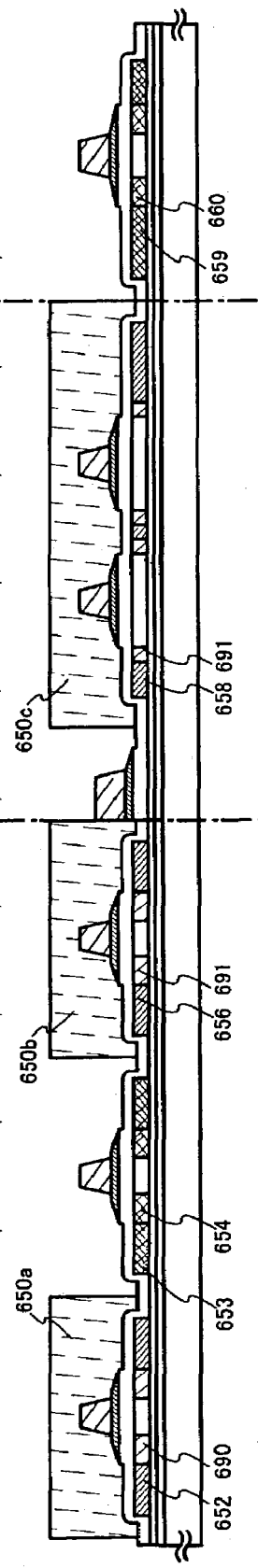
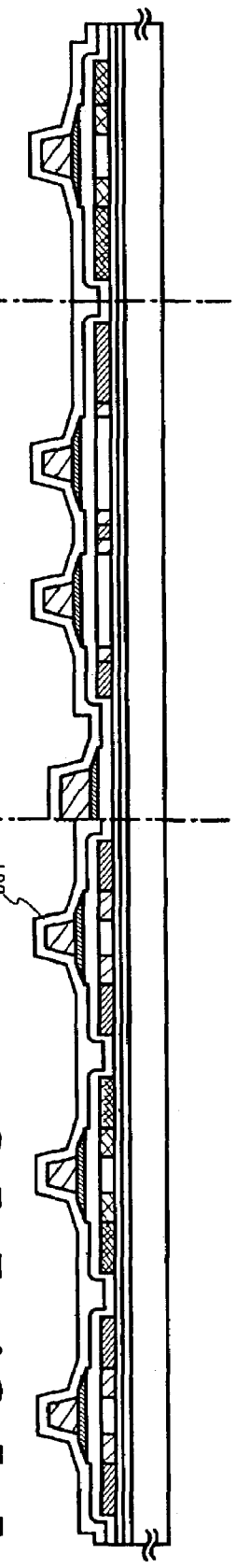
FIG. 14A
FIG. 14B
FIG. 14C

Prior Art

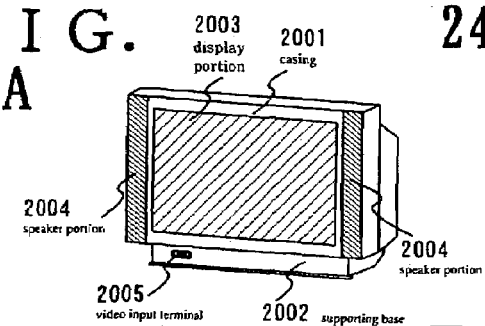

FIG. 24A 2003 display portion
2001 casing
2004 speaker portion
2004 speaker portion
2005 video input terminal
2002 supporting base

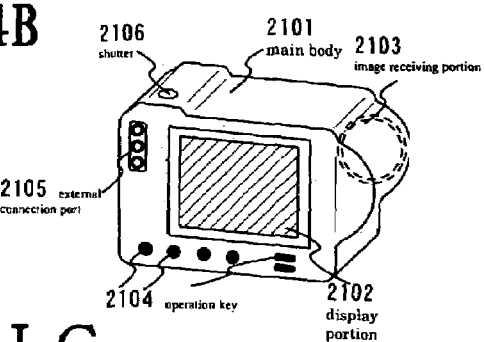

FIG. 24B 2106 shutter
2101 main body
2103 image receiving portion
2105 external connection port
2104 operation key
2102 display portion

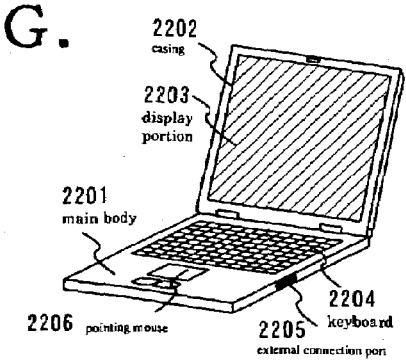

FIG. 24C 2202 casing
2203 display portion
2201 main body
2206 pointing mouse
2204 keyboard
2205 external connection port

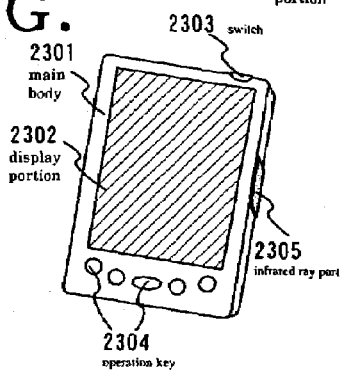

FIG. 24D 2303 switch
2301 main body
2302 display portion
2305 infrared ray port
2304 operation key

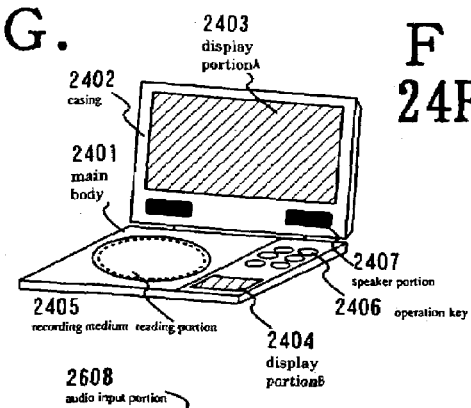

FIG. 24E 2403 display portion A
2402 casing
2401 main body
2407 speaker portion
2405 recording medium reading portion
2406 operation key
2404 display portion B

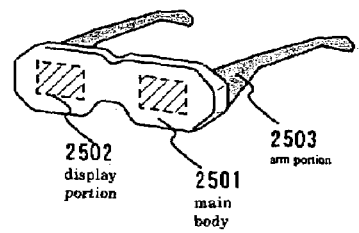

FIG. 24F 2502 display portion
2503 arm portion
2501 main body

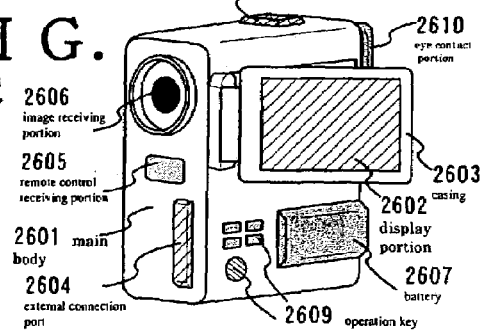

FIG. 24G 2608 audio input portion
2610 eye contact portion
2606 image receiving portion
2605 remote control receiving portion
2601 main body
2604 external connection port
2603 casing
2602 display portion
2607 battery
2609 operation key

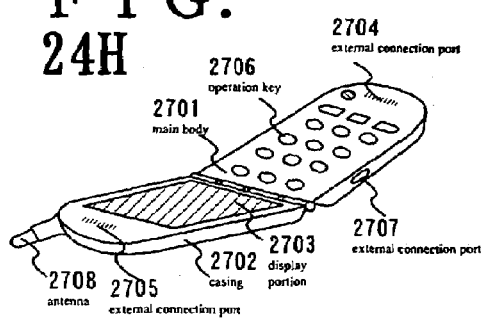

FIG. 24H 2704 external connection port
2706 operation key
2701 main body
2703 display portion
2707 external connection port
2708 antenna
2705 external connection port
2702 casing

LASER APPARATUS, LASER IRRADIATION METHOD, SEMICONDUCTOR MANUFACTURING METHOD, SEMICONDUCTOR DEVICE, AND ELECTRONIC EQUIPMENT

BACKGROUND OF THE INVENTION

Field of the Invention

The present invention relates to laser processing apparatus and laser irradiation method which use laser light to crystallize, or activate, after ion implantation, a semiconductor substrate, a semiconductor film, or the like. The invention also relates to a semiconductor device and its manufacturing method using this laser apparatus and to electronic equipment using this semiconductor device.

In recent years, the technique of forming TFTs on a substrate has made a great advance and application of TFTs to active matrix type semiconductor display devices is being developed. TFTs formed of polysilicon films, in particular, have higher field effect mobility (also referred to as mobility) than conventional TFTs that use amorphous silicon films and accordingly can operate at high speed. Therefore pixels can be controlled by a driving circuit formed on the same substrate on which the pixels are formed instead of a driving circuit external to the substrate as with the conventional technique.

As substrates for use in semiconductor devices, glass substrates are deemed more promising than single crystal silicon substrates for economic reason. Glass substrates have poor heat-resistance and are easily deformed by heat. Therefore, when forming a polysilicon TFT on a glass substrate, laser annealing is used to crystallize a semiconductor film in order to avoid thermal deformation of the glass substrate.

The laser annealing is characteristic in that a processing time can be remarkably reduced as compared with annealing utilizing radiant heating or thermal conductive heating, that a semiconductor or a semiconductor film is selectively and locally heated so that a substrate is scarcely thermally damaged, and the like.

The term "laser annealing" herein indicates a technique for recrystallizing a damaged layer or an amorphous layer formed on a semiconductor substrate or in a semiconductor film or a technique for crystallizing an amorphous semiconductor film formed on a substrate. The term "laser annealing" also includes a technique that is applied to leveling or improvement of a surface quality of the semiconductor substrate or the semiconductor film. Applicable laser oscillation devices are: gas laser oscillation devices represented by an excimer laser; and solid laser oscillation devices represented by a YAG laser. Such laser oscillation devices are known to heat a surface layer of a semiconductor by laser beam irradiation for an extremely short period of time, i.e., about several tens of nanoseconds to tens hundreds of microseconds so as to crystallize the surface layer.

Lasers are roughly divided into two, pulse oscillation type and continuous wave type, by their oscillation methods. Pulse oscillation lasers are relatively high in output energy and therefore the size of beam spot can be set to several $cm^2$ to increase the mass-productivity. In particular, if the shape of beam spot is processed by an optical system into a linear shape 10 cm or more in length, a substrate can be irradiated with the laser light efficiently to increase the mass-productivity even more. Accordingly, using pulse oscillation lasers to crystallize semiconductor films have been becoming mainstream.

In recent years, however, it has been found that the grain size of crystals formed in a semiconductor film is larger when a continuous wave laser is used to crystallize a semiconductor film than when a pulse oscillation laser is used. With crystals of larger grain size in a semiconductor film, the mobility of TFTs formed from this semiconductor film is increased while reducing fluctuation in characteristics between the TFTs which is caused by grain boundaries. As a result, continuous wave lasers are now suddenly attracting attention.

Continuous wave lasers, however, are generally smaller in maximum output energy than pulse oscillation lasers and therefore the size of beam spot is as small as about $10^{-3}$ $mm^2$. Accordingly, when a large substrate is to be processed, the position at which the substrate is irradiated with the beam has to be moved longitudinally and laterally.

There are three ways to move the beam irradiation position longitudinally and laterally. One is to change the irradiation direction of beam while the position of the substrate is fixed. Another method is to move the position of the substrate while the irradiation direction of beam is fixed. The third method is a combination of the first and second methods.

When the irradiation direction of beam is changed, the irradiation angle of beam with respect to the substrate is varied depending on the position of irradiation. A change in irradiation angle causes variation in intensity of returning beam that has been reflected by the substrate as well as in intensity of interference between different positions on the substrate. Therefore it makes uniform processing throughout the substrate impossible. For example, when a semiconductor film is crystallized by laser irradiation, the crystallinity is varied depending on the position on the substrate.

On the other hand, when the position of the substrate is moved while the irradiation direction of beam is fixed, the irradiation angle of beam with respect to the substrate is fixed irrespective of the substrate position. Therefore the problem described above is avoided and, in addition, this method makes the optical system simpler.

The problem in moving the substrate is time loss accompanying the change of course.

FIG. 20 uses an arrow to indicate the direction in which the beam irradiation position on the substrate moves when the substrate position is moved while the irradiation direction of beam is fixed. In laser light irradiation in general, the irradiation position is moved in one direction and then the course is changed to move the irradiation position in another direction. In this case, if the moving speed of the irradiation position is varied depending on the substrate position, it is difficult to process the substrate uniformly. Therefore keeping the moving speed of irradiation position constant is important and it is common to change the moving direction of irradiation position when the irradiation position deviates from the substrate as shown in areas surrounded by broken lines in FIG. 20. After the irradiation position deviates from the substrate, the movement of the substrate is stopped to change the moving direction of the substrate. Then it is necessary to wait for the substrate to reach a certain moving speed again before irradiating the substrate with laser light. Therefore the change of course of substrate inevitably requires a given amount of time and causes a reduction in substrate processing speed.

This is the problem that arises also in the method where the irradiation direction of beam is changed, and causes a reduction in substrate processing speed since a given amount of time is needed to change the irradiation direction of beam.

In the case of continuous wave lasers, in particular, the processing efficiency is poor since the beam spot size is small in the first place unlike pulse oscillation lasers and improving the substrate processing speed is an important object to achieve.

SUMMARY OF THE INVENTION

The present invention has been made in view of the above, and an object of the present invention is therefore to provide continuous wave laser apparatus with processing efficiency enhanced from prior art and a method of manufacturing a semiconductor device using the laser apparatus.

The laser apparatus of the present invention has first means for placing a process object, second means for rotating the process object placed by the first means, third means for moving the center of the rotation along a straight line, and fourth means for irradiating a certain region within the moving range of the process object with laser light from fixed direction at a fixed position.

The certain region to be irradiated with laser light is on a line extended from the straight line along which the center of the rotation is moved.

While the process object is rotated by the second means, the third means moves the center of the rotation along a straight line. In this way, an area where the certain region to be irradiated with laser light overlaps the process object is moved and the entire process object can be irradiated with laser light.

In order to make the laser light irradiation time the same for every portion of the process object, the rotation speed is adjusted as the center of the rotation is moved. Specifically, the rotation speed is lowered as the certain region to be irradiated with laser light becomes further from the center of the rotation whereas the rotation speed is raised as the region approaches the center of the rotation. By adjusting the rotation speed, fluctuations of characteristics between TFTs can be reduced.

Owing to the second means and third means, the laser apparatus of the present invention can move the laser light irradiation position on a process object in directions X and Y without changing the moving direction of the process object and can irradiate the entire surface of the process object with laser light even though the laser light is radiated from a fixed direction at a fixed position. Therefore the invention can avoid time loss that accompanies a change in moving direction of process object and can have enhanced processing efficiency compared to prior art.

The irradiation angle of laser light radiated from the fourth means is fixed with respect to a process object irrespective of irradiation position. This prevents a returning beam that has been reflected in the process object, or interference, from varying in intensity between different irradiation positions, and makes it possible to perform generally uniform processing on the process object. When a semiconductor film is crystallized by laser irradiation, for example, the invention can prevent variation in crystallinity between semiconductor films in different positions. Furthermore, the present invention can make an optical system simpler than in the case where the irradiation direction of beam is changed to irradiate the entire process object with laser light.

If more than one first means are provided, a plurality of process objects can be processed simultaneously. In this case, centers of rotation of all process objects have to coincide with one another. The above-mentioned structure can enhance the processing efficiency even more.

The present invention is on the premise that its laser apparatus is a continuous wave laser. However, a pulse oscillation laser may also be used.

The laser apparatus of the present invention have uses other than crystallization of a semiconductor film. The laser apparatus of the present invention can be employed in all of the laser annealing methods described above.

BRIEF DESCRIPTION OF THE DRAWINGS

In the accompanying drawings:

FIGS. 3A and 3B are diagrams showing the direction in which laser light irradiation position moves in a process object;

FIGS. 8A to 8D are diagrams showing laser light tracks on a liquid crystal panel;

FIGS. 13A to 13C are diagrams showing a method of manufacturing a semiconductor device using laser apparatus of the present invention;

FIGS. 14A to 14C are diagrams showing a method of manufacturing a semiconductor device using laser apparatus of the present invention;

FIGS. 24A to 24H are diagrams of electronic equipment each using a semiconductor device of the present invention;

DETAILED DESCRIPTION OF THE PREFERRED EMBODIMENTS

Embodiment Mode

Figure 1A:
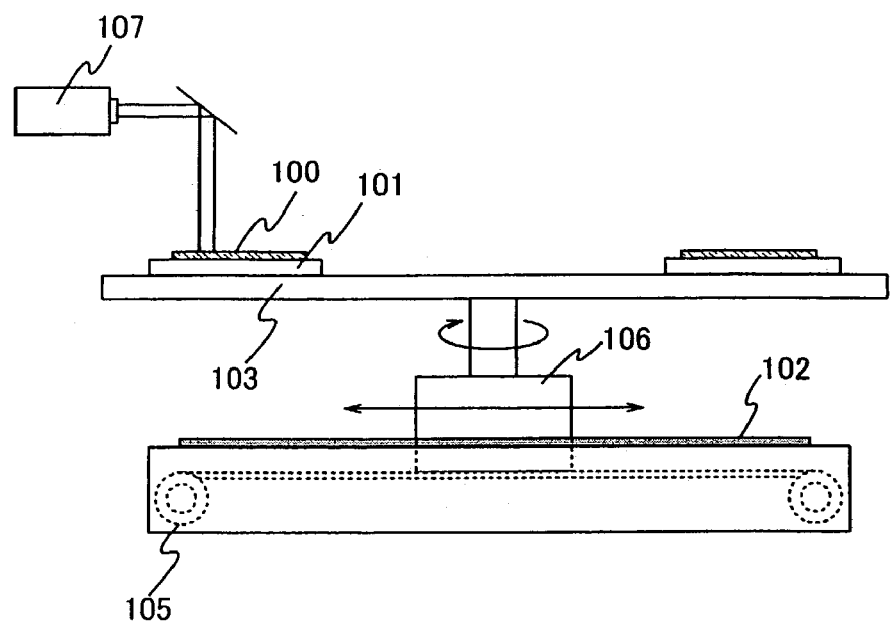
FIGS. 1A and 1B are diagrams showing the structure of laser apparatus according to the present invention.

The structure of laser apparatus of the present invention will be described below. FIG. 1A shows a side view of laser apparatus of the present invention and FIG. 1B shows a top view thereof.

Figure 1B:
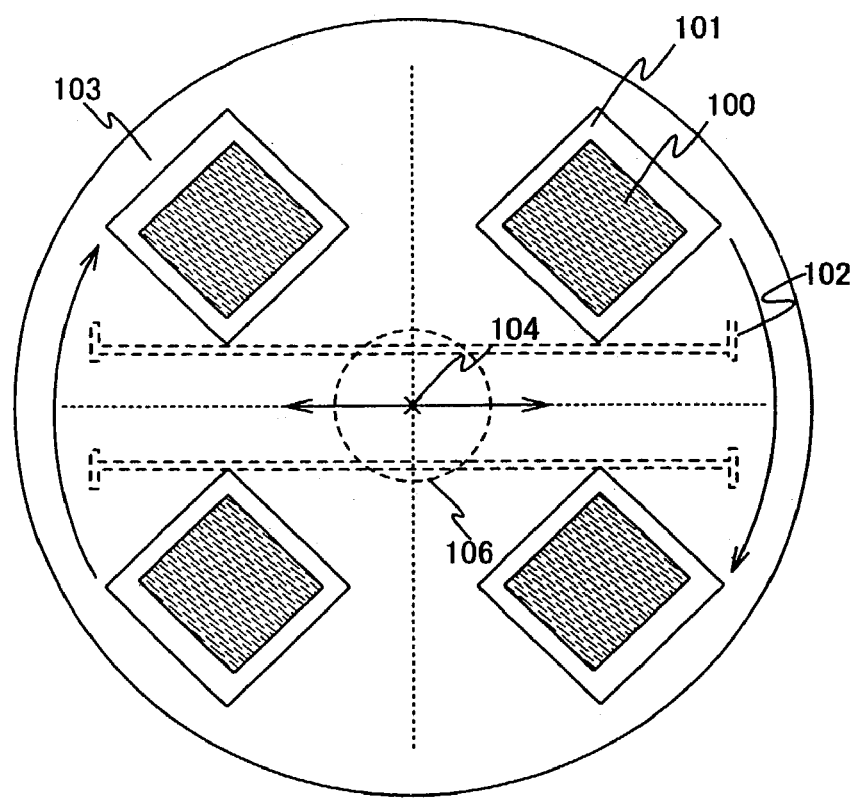

The laser apparatus of the present invention in FIGS. 1A and 1B has a plurality of stages 101 that correspond to the first means for placing process objects. In the example shown here, there are four stages. By providing plural stages and processing plural process objects in parallel, the processing efficiency can be enhanced more. Process objects 100 to be irradiated with laser light are placed on the respective stages 101.

The stages 101 are placed on a rotating base 103. The rotating base 103 uses a motor 106 for the rotating base 103 (hereinafter referred to as rotating base motor 106) to rotate the process objects in the direction indicated by the arrow with 104 as the center. The rotation direction can be set at designer's discretion. The rotating base 103 and the rotating base motor 106 correspond to the second means of the laser apparatus of the present invention. However, the second means of the laser apparatus of the present invention is not limited thereto and can be any means as long as it can rotate the process objects 100 placed on the stages 101.

Centers of rotation of all the process objects 100 coincide with one another.

The rotating base 103 is movable along a guide rail 102. The guide rail is installed in a manner that makes the center of rotation of the rotating base 103 move on a straight line when the rotating base 103 is moved along the guide rail 102.

Means for moving the rotating base 103 along the guide rail 102 corresponds to the third means of the laser apparatus of the present invention. Specifically, a motor 105 for moving the rotating base 103 (hereinafter referred to as moving motor 105) and the guide rail 102 in FIGS. 1A and 1B correspond to the third means. However, the third means of the laser apparatus of the present invention is not limited to those in FIGS. 1A and 1B as long as it can move the center of rotation of a process object along a straight line.

Laser light is radiated from a fixed direction at a fixed position by a laser oscillator and other optical system 107 to irradiate a specific region within the moving range of the process objects 100. The laser oscillator and other optical system 107 corresponds to the fourth means of the laser apparatus of the present invention.

The laser employed is chosen to suite purpose of processing. A known laser can be used for the fourth means of the laser apparatus of the present invention. Continuous wave or pulse oscillation gas lasers or solid-state lasers are employable. Examples of gas laser include an excimer laser, an Ar laser, and a Kr laser. Examples of solid-state laser include a YAG laser, a $YVO_4$ laser, a YLF laser, a $YAlO_3$ laser, a glass laser, a ruby laser, an alexandrite laser, a Ti: sapphire laser, and a $Y_2O_3$ laser. Employed as a solid-state laser is a laser that uses a crystal such as YAG, $YVO_4$, YLF, or $YAlO_3$ doped with Cr, Nd, Er, Ho, Ce, Co, Ti, Yb, or Tm. The fundamental wave of the laser varies depending on the material used to dope the laser, and laser light having a fundamental wave of around 1 μm is obtained. The harmonic for the fundamental wave can be obtained by using a non-linear optical element.

It is also possible to use ultraviolet laser light obtained by converting infrared laser light that has been radiated from a solid-state laser into green laser light using a non-linear optical element and then converting the green laser light using another non-linear optical element.

The laser apparatus of the present invention may have means to adjust the temperature of a process object in addition to the four means described above.

Figure 2:
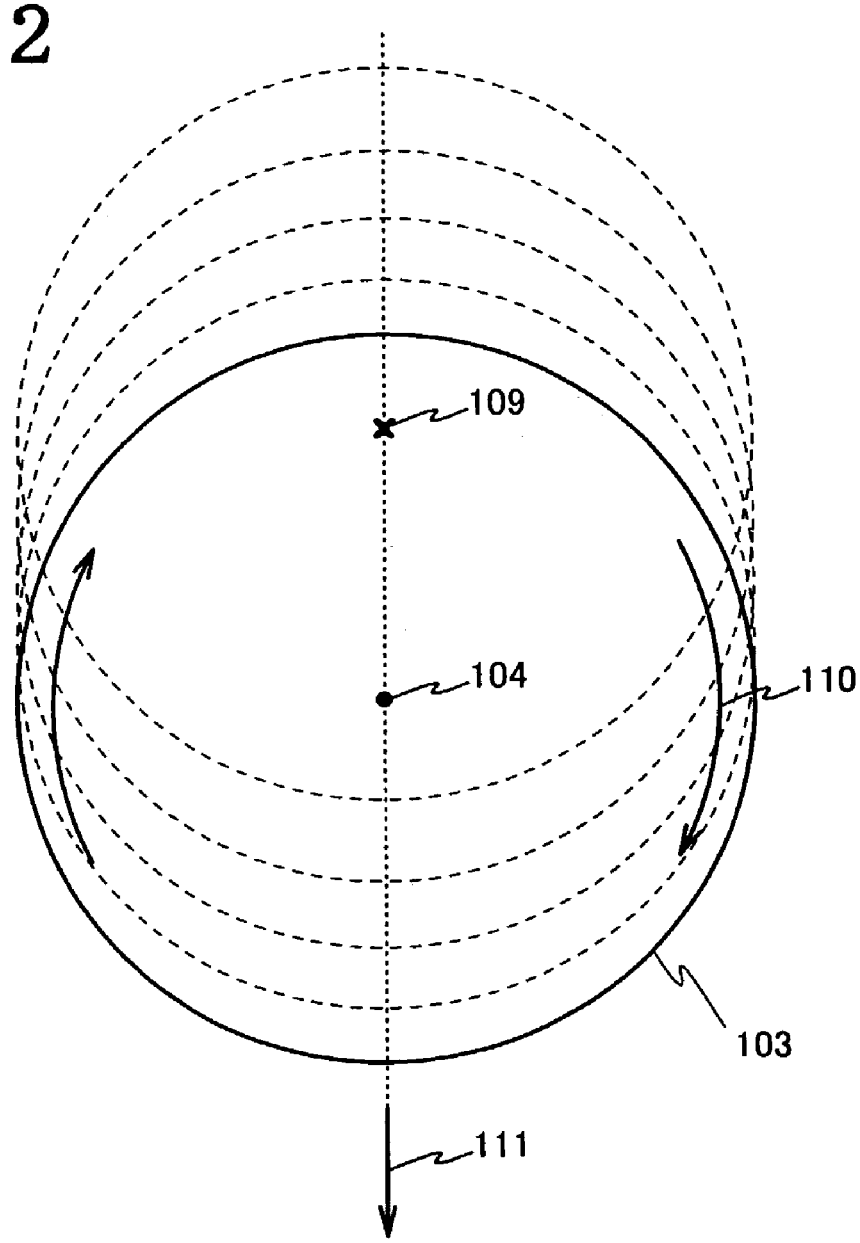
FIG. 2 is a diagram showing the structure of laser apparatus according to the present invention.

FIG. 2 shows a simplified movement of the rotating base of FIGS. 1A and 1B. The rotating base 103 is rotated in the direction indicated by an arrow 110 with 104 as the center. The rotation center 104 moves in the direction indicated by an arrow 111. A certain region 109 to be irradiated with laser light is on a line extended from the linear track made by the movement of the center 104 of the rotating base 103.

Described next is how the process objects 100 are irradiated with laser light in practice. FIGS. 3A and 3B illustrate the manner in which the process objects 100 are irradiated with laser light by the laser apparatus shown in FIGS. 1A and 1B.

FIGS. 3A and 3B show positional changes with time of the rotating base 103 during laser light irradiation of the process objects 100. FIG. 3A is set earlier in time than FIG. 3B. The stages 101 are rotated in the direction indicated by the arrow 110 with 104 as the center, and the rotation center 104 of the rotating base 103 moves in the direction indicated by the arrow 111.

The certain region 109 to be irradiated with laser light is on a line extended from the linear track made by the movement of the center 104 of the rotating base 103.

As the rotating base 103 is rotated, the certain region 109 to be irradiated with laser light is irradiated on the rotating base 103 in such a manner as to draw a track 108 indicated by the broken line. The laser light track 108 forms a circle centered around 104. Each of the process objects 100 are irradiated with laser light at a portion that overlaps the laser light track.

As the center 104 of the rotating base 103 moves in the direction of the arrow 111 to widen the distance between the center 104 and the certain region 109 to be irradiated with laser light, the radius of the circle that the certain region 109 to be irradiated with laser light forms is increased. On the other hand, when the distance between the center 104 and the certain region 109 to be irradiated with laser light narrows, the radius of the circle that the certain region 109 to be irradiated with laser light forms is decreased. Therefore, portions where the process objects 100 overlap the laser light track 108 are shifted with time and ultimately the entire surfaces of the process objects 100 can receive laser light irradiation.

Since the rotating base 103 is irradiated with laser light both in portions covered with the process objects 100 and in portions not covered with 100, it is desirable to use a material that is not deformed or damaged by laser light for the rotating base 103.

Figure 4:
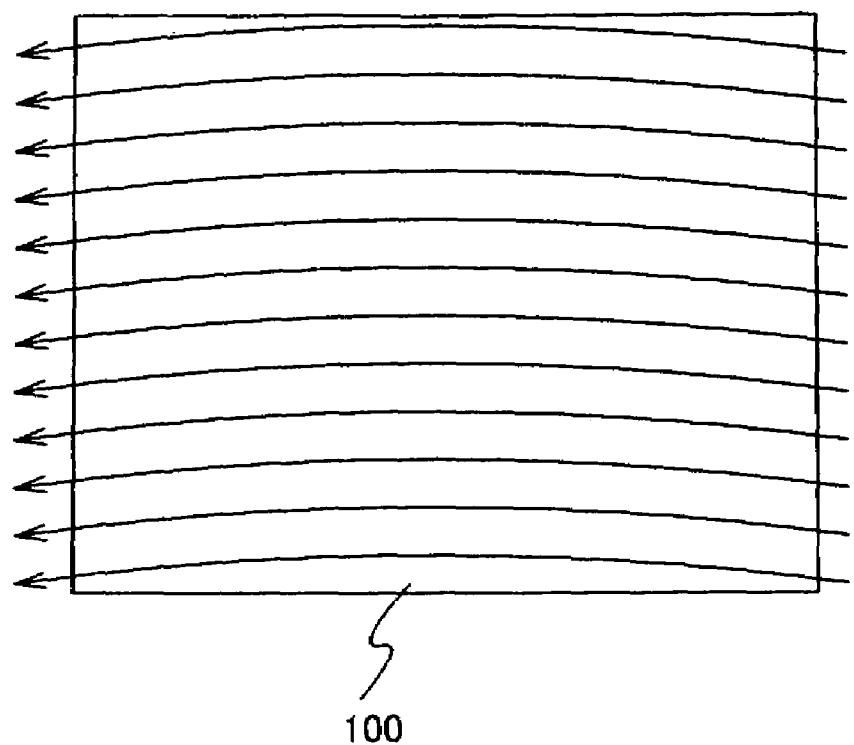
FIG. 4 is a diagram showing the direction in which laser light irradiation position moves in a process object.

FIG. 4 shows in arrows the moving direction of laser light irradiation position in the process objects 100 that are irradiated with laser light in FIGS. 3A and 3B. The number of arrows matches the number of rotations of the rotating base 103, and the arrows are increased in number as the rotation number is raised.

In order to make the laser light irradiation time the same for every portion of the process objects, the rotation speed is adjusted as the center of the rotation is moved. It is important to determine the rotation speed of the process objects 100 and the moving speed of the rotation center by taking into account a proper laser light irradiation time for each portion of the process objects 100. Specifically, the rotation speed is lowered as the certain region to be irradiated with laser light becomes further from the center of the rotation whereas the rotation speed is raised as the region approaches the center of the rotation. For instance, when the laser apparatus is used in crystallization of a semiconductor film and the energy density is $5 \times 10^4$ to $1.3 \times 10^5$ cm$^2$/W, the moving speed of irradiation position may be kept at 10 to 100 cm/sec., preferably 20 to 50 cm/sec.

The rotation speed of the process objects 100 and the moving speed of the rotation center 104 have to be adjusted appropriately in order to irradiate the entire surfaces of the process objects 100 with laser light. If the moving speed of the rotation center 104 is too fast with respect to the rotation speed of the process objects 100, it is impossible to irradiate the entire surfaces of the process objects with laser light.

Each portion of the process objects 100 can be irradiated with laser light several times by adjusting the rotation speed of the process objects 100 and the moving speed of the rotation center. Alternatively, the process objects 100 can receive several times of laser irradiation by moving the center of the rotation in one direction and then in the opposite direction.

With the above-mentioned structure, the laser apparatus of the present invention can move the laser light irradiation position in a process object without changing the moving direction of the process object and can irradiate the entire surface of the process object with laser light even though the laser light is radiated from a fixed direction at a fixed position. Therefore the invention can avoid time loss that accompanies a change in moving direction of process object and can have enhanced processing efficiency compared to prior art.

Moreover, the irradiation angle of laser light is fixed with respect to a process object irrespective of irradiation position. This prevents a returning beam that has been reflected by the process object, or interference, from varying in intensity between different irradiation positions, and makes it possible to perform generally uniform processing on the process object. When semiconductor films are crystallized by laser irradiation, for example, the invention can prevent variation in crystallinity between process objects in different positions. Furthermore, the present invention can make an optical system simpler than in the case where the irradiation direction of beam is changed to irradiate the entire process object with laser light.

Embodiments of the present invention will be described below.

Embodiment 1

This embodiment describes a case of irradiating an object with laser light several times such that the edge of laser light in one irradiation does not overlap the edge of laser light in another irradiation.

In general, the energy of laser light at its edge is different from the energy of the rest of the laser light, thereby making it difficult to perform uniform processing on a process object. Therefore, when an object is irradiated with laser light several times, overlapping of laser light edges is avoided to lessen the unevenness in energy at the edges. In this way, the process object can receive generally uniform processing.

One method to avoid overlapping of laser light edges is to shift the center of rotation of a process object in the second time laser irradiation from the rotation center in the first time laser irradiation by a distance smaller than the width of the laser light track so that the moving range of the process object is shifted. Note that the rotation center in the second time and subsequent laser irradiation is placed on a line extended from the line that connects the rotation center in the first time laser irradiation with a fixed position onto which laser light is radiated.

Figure 5A:
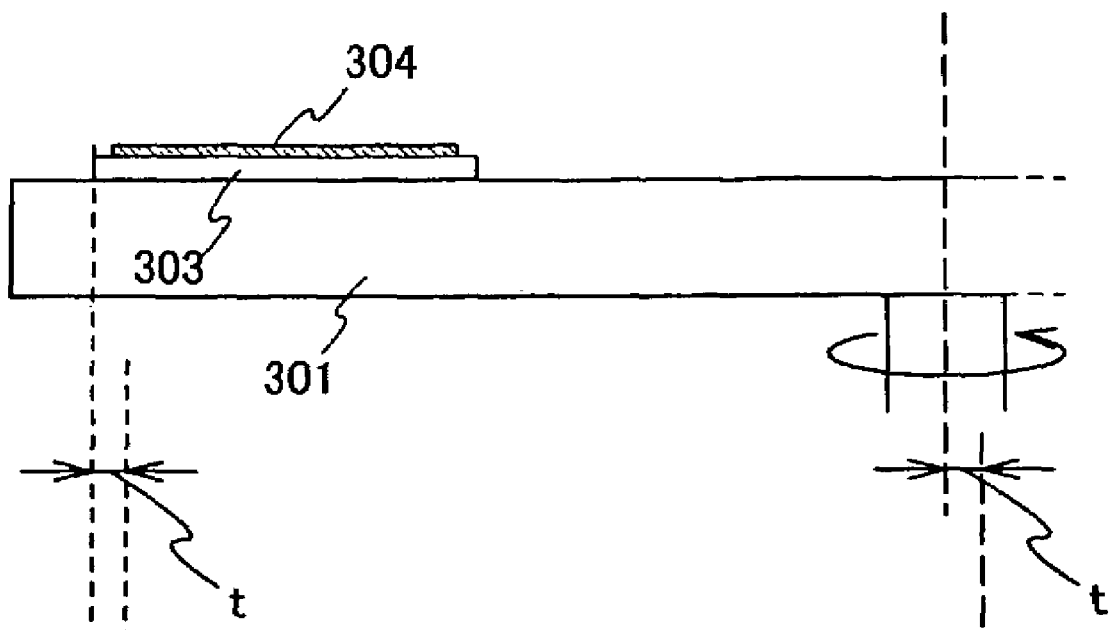
FIGS. 5A and 5B are diagrams showing positions at which an object is irradiated with laser light.
Figure 5B:
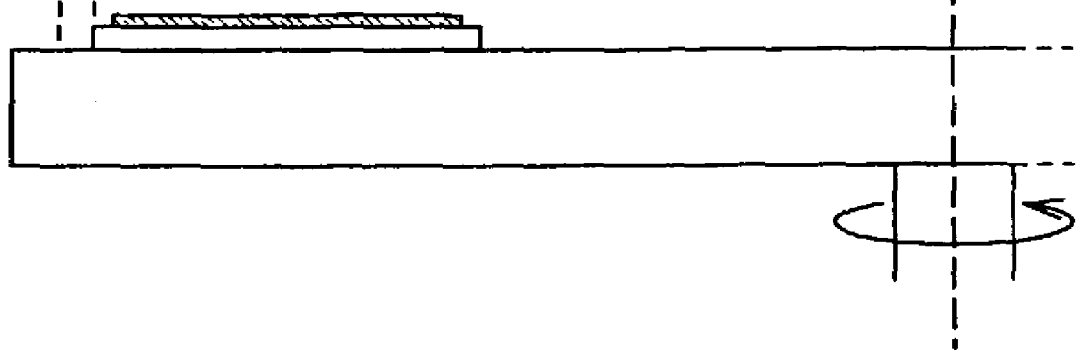

FIG. 5A is a sectional view of the laser apparatus at the start of the first time laser irradiation and FIG. 5B is a sectional view of the laser apparatus at the start of the second time laser irradiation. Reference numeral 301 denotes a rotating base; 303, a stage, and 304; a process object.

The center of the rotating base 303 in the second time laser irradiation is shifted from that in the first time laser irradiation by a width t. The width t is set smaller than the width of the laser light track. The position of the process object at the start of the second time laser irradiation is shifted from the position at the start of the first time laser irradiation by the width t. Accordingly, the moving range of the process object 304 accompanying the movement of the rotation center also differs in the first time and second time laser irradiation.

With the above-mentioned method, overlapping of the laser light edge in the first time laser irradiation with the laser light edge in the second time laser irradiation can be avoided to lessen the unevenness in energy at the edges and to give a process object generally uniform processing.

Embodiment 2

This embodiment describes a case, which is different from embodiment 1, of irradiating an object with laser light several times such that the edge of laser light in one irradiation does not overlap the edge of laser light in another irradiation.

Figure 6:
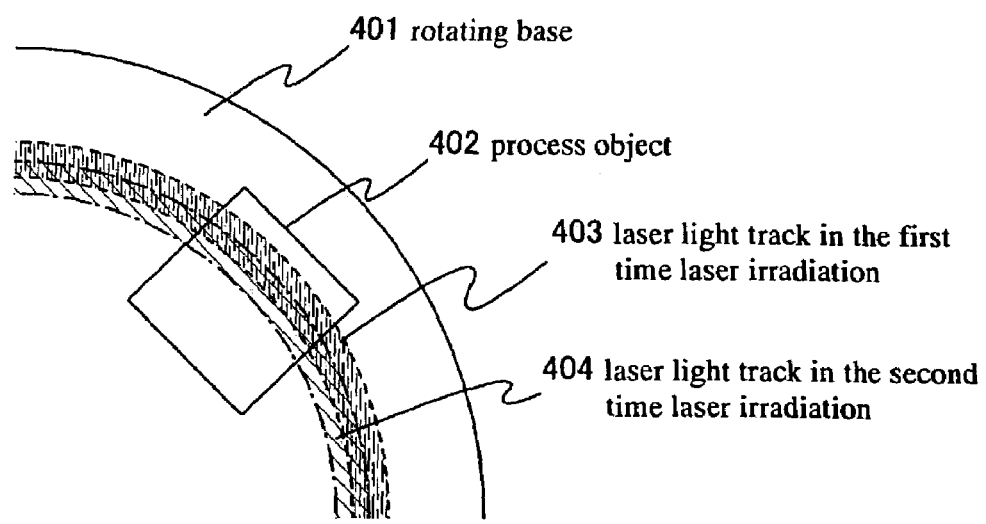
FIG. 6 is a diagram showing positions at which an object is irradiated with laser light.

This embodiment avoids overlapping of laser edges by changing the laser light irradiation position on a rotating base in the second time laser irradiation from the position in the first time laser irradiation. FIG. 6 shows laser light tracks on a rotating base in the first time laser irradiation and the second time laser irradiation. Reference numeral 401 denotes a rotating base and reference numeral 402 denotes a process object.

Denoted by reference numeral 403 is a laser light track in the first time laser irradiation and reference numeral 404 indicates a laser light track in the second time laser irradiation. The laser light track 403 and the laser light track 404 overlap each other and overlapping of their edges is avoided. In the first time laser irradiation, the process object 402 is processed at a portion where it overlaps the laser light track 403. In the second time laser irradiation, the process object 402 is processed at a portion where it overlaps the laser light track 404.

With the above-mentioned method, overlapping of the laser light edge in the first time laser irradiation with the laser light edge in the second time laser irradiation can be avoided to lessen the unevenness in energy at the edges and to give a process object generally uniform processing.

This embodiment may be combined with Embodiment 1.

Embodiment 3

This embodiment describes a structure for irradiating a process target film that is formed on a process object with laser light from its front and back.

Figure 7A:
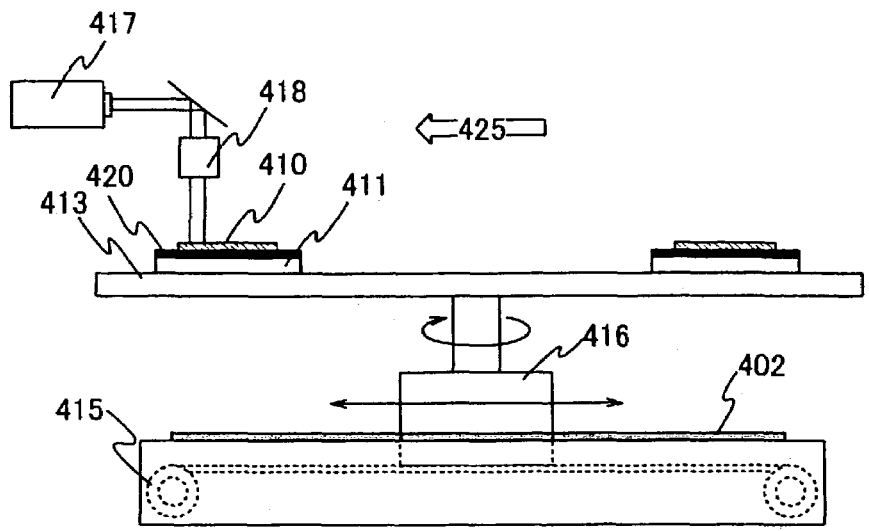
FIGS. 7A to 7C are diagrams showing the structure of laser apparatus according to the present invention.

FIG. 7A is a side view of laser apparatus of this embodiment. The laser apparatus of the present invention in FIG. 7A has a reflector 420 for reflecting laser light between a process object 410 and a stage 411.

The stage 411 is placed on the rotating base 413, which is rotated by a rotating base motor 416. The rotating base 413 is movable along a guide rail 402 by a moving motor 415. The guide rail 402 is installed in a manner that makes the center of rotation of the rotating base 413 move on a straight line when the rotating base 413 is moved along the guide rail 402.

Laser light is radiated from a fixed direction at a fixed position by a laser oscillator and other optical system 417 and by an optical system 418 to irradiate the process object 410. A certain region to be irradiated with laser light is on a line extended from the linear track along which the center of rotation of the rotating base 413 is moved.

In this embodiment, laser light enters a substrate at an angle instead of allowing laser light to enter the substrate vertically. This is to prevent returning light, namely, a part of laser light that is reflected at the substrate surface to travel back the same light path it used when entering, from affecting the laser apparatus by causing fluctuation in output and frequency of the laser oscillator and by damaging the rod. In this case, since laser light is highly directional and has high energy density, the reflected light is preferably absorbed by a damper to prevent the reflected light from irradiating an area that should not be irradiated. Cooling water is circulated in the damper to avoid a temperature rise of the damper due to absorption of reflected light.

Instead of making laser light enter the substrate at an angle, an isolator may be provided to remove returning light and stabilize laser oscillation.

Figure 7B:
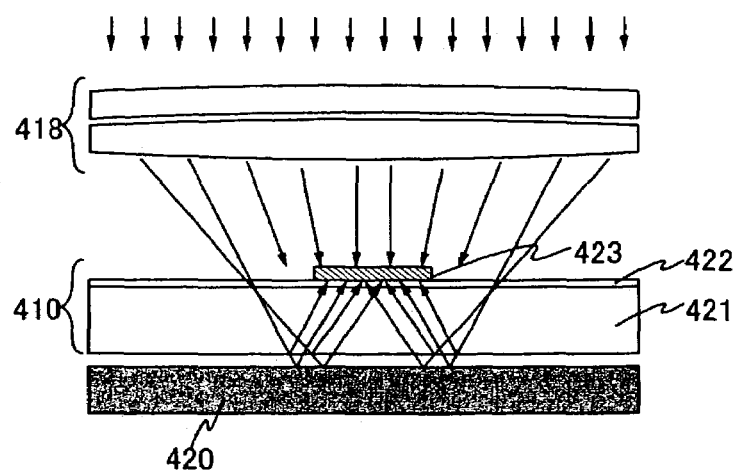

FIG. 7B shows the positional relation between the process object 410 and the reflector 420 in FIG. 7A.

In FIG. 7B, the process object 410 is composed of a light-transmissive substrate 421, an insulating film 422 that is formed on a surface of the substrate (the side on which a thin film or an element is to be formed), and an amorphous semiconductor film 423. The reflector 420 for reflecting laser light is placed under the light-transmissive substrate 421.

A glass substrate, a quartz substrate, a crystallized glass substrate, or a plastic substrate is used for the light-transmissive substrate 421. The insulating film 422 is an insulating film containing silicon, such as a silicon oxide film or a silicon oxynitride (SiOxNy) film. The amorphous semiconductor film 410 can be an amorphous silicon film or an amorphous silicon germanium film.

The reflector 420 may be a substrate with a metal film formed on its surface (on the side that reflects laser light), or may be a substrate formed of a metal element. The metal film can be formed from any material. Typically, the metal film contains one element selected from the group consisting of aluminum, silver, tungsten, titanium, and tantalum.

Instead of the reflector 420, a metal film as the one described above may be formed directly on the back side of the light-transmissive substrate 421 (opposite to the surface on which the insulating film 422 and the semiconductor film 423 are formed) to reflect laser light. However, this structure can be employed only if the metal film formed on the back side is not removed during a semiconductor device manufacturing process.

The amorphous semiconductor film 410 is irradiated with laser light that has been processed into a linear shape through an optical system 418 (its cylindrical lens alone is shown in the drawing). It is important to design the optical system 418 such that the amorphous semiconductor film 410 is irradiated with laser light that travels through the optical system 418 to directly irradiate the amorphous semiconductor film 410 and with laser light that is reflected by the reflector 420 before it irradiates the amorphous semiconductor film 410. In this specification, laser light that irradiates the front side of the amorphous semiconductor film is called primary laser light and one that irradiates the back side of the amorphous semiconductor film is called secondary laser light.

Laser light travels through the optical system 418 and the light collection process gives the laser light an incident angle of 45 to 90° with respect to the substrate surface. Accordingly, the secondary laser light reaches the back side of the amorphous semiconductor film 410 to irradiate the film. The secondary laser light can be obtained more efficiently if the reflection surface of the reflector 420 is waved so as to diffuse laser light.

The second harmonic of YAG laser, in particular, has a wavelength of 532 nm and is in a wavelength range (around 530 nm) in which light irradiating an amorphous semiconductor film is least reflected by the amorphous semiconductor film. In this wavelength range, an ample quantity of laser light is transmitted through the amorphous semiconductor film and therefore, by using the reflector, the amorphous semiconductor film can be irradiated with laser light efficiently again, this time from the back side. The second harmonic has a laser energy as large as about 1.5 J/pulse (the maximum value in existing YAG laser apparatus). Therefore, when processed into a line shape, the length of the line shaped laser beam can be greated increased so that a larger area can be irradiated at once.

Figure 7C:
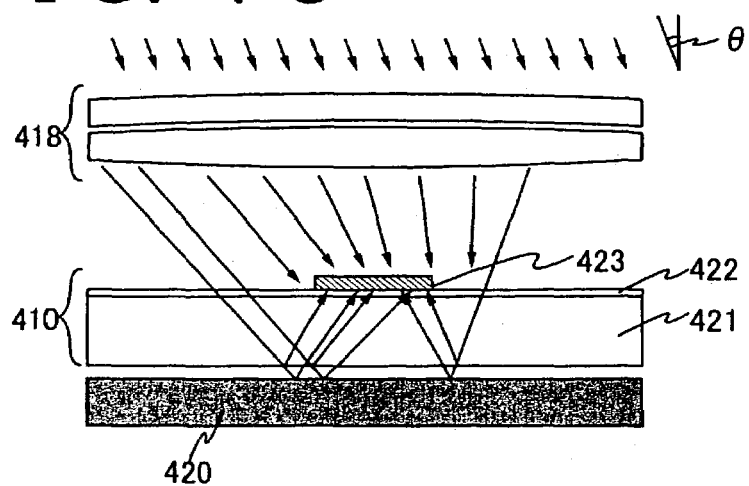

FIG. 7C shows the positional relation between the process object 410 and the reflector 420 viewed from the direction of an arrow 425 of FIG. 7A. In this embodiment, the incident angle with respect to the substrate 421 is kept larger than 0° and smaller than 90° in order to prevent returning light from traveling the initial path back to the laser oscillator 417. More specifically, the incident angle is kept between 5° and 30°.

The incident plane is defined as a plane which is perpendicular to the irradiation plane and which includes a short side of a rectangle of the above-described long beam shape. Then it is desirable if an incident angle $\phi$ of the above-described laser beam satisfies $\phi \geq \arctan (W/2d)$; W represents the length of the short side and d represents the thickness of a substrate transmissive of the laser beam when it is arranged on the irradiation plane. When the laser beam track is not on the incident plane, the incident angle of the track projected onto the incident plane is set as $\phi$. When a laser beam enters the substrate at this incident angle $\phi$, interference between light reflected at the front side of the substrate and reflected light from the back side of the substrate can be avoided to give the substrate uniform laser beam irradiation. Above-mentioned discussion set the refractive factor of the substrate to 1. Actually, there are many refractive factor of the substrate 1.5. Based on said obtained value, bigger calculated value is obtained than the degree of the angle calculated in the above discussion. However, energy of both ends of lengthwise of the beam spot is reduced, thereby the interference at the portion has small effects. Thus, above-calculated value can make the interference eliminate sufficiently.

As described above, according to this embodiment, laser light can be split into primary laser light and secondary laser light to irradiate the front side and back side of an amorphous semiconductor film.

This embodiment may be combined with Embodiments 1 and 2.

Embodiment 4

This embodiment describes an example in which a process of crystallizing a semiconductor film by laser annealing using the laser apparatus of the present invention is applied to a method of manufacturing an active matrix semiconductor display device that has a driving circuit and a pixel portion on the same substrate.

FIG. 8A is a top view of a liquid crystal panel having a pixel portion 201, a signal line driving circuit 202, and a scanning line driving circuit 203 on a substrate 200. In FIG. 8A, the laser light irradiation position moves in a direction indicated by an arrow of broken line.

When a semiconductor film is irradiated with laser light by the laser apparatus of the present invention, the laser light track forms not exactly a straight line but a gentle arc. Therefore, when a semiconductor film is crystallized using the laser apparatus of the present invention, the traces of laser light irradiation form arcs on the semiconductor film. The arcs are different from one another in radius of curvature. The radius of curvature is small when the irradiation position is close to the rotation center and it is large when the irradiation position is far from the rotation center. However, active layers of TFTs formed by patterning the semiconductor film are small in size compared to the radii of the arcs and therefore the traces of laser light irradiation that are left in the active layers are generally linear.

A part of the pixel portion 201 of FIG. 8A is denoted by reference numeral 204 and is enlarged in FIG. 8B. A part of the signal line driving circuit 202 of FIG. 8A is denoted by reference numeral 205 and is enlarged in FIG. 8C. A part of the scanning line driving circuit 203 of FIG. 8A is denoted by reference numeral 206 and is enlarged in FIG. 8D.

Plural island-like semiconductor films to serve as active layers of TFTs are formed in each of the pixel portion 201, signal line driving circuit 202, and scanning line driving circuit 203. Denoted by reference numerals 207, 208, and 209 are portions that are made into active layers of TFTs by patterning. A broken line 220 indicates a trace of laser light irradiation.

The laser light irradiation trace 220 runs almost parallel to the channel moving direction or the opposite direction.

This embodiment may be combined with Embodiments 1 to 3.

Embodiment 5

This embodiment describes an example in which a semiconductor film formed on an insulating surface by a known method is patterned to obtain island-like semiconductor films and then crystallized by laser annealing using the laser apparatus of the present invention.

Figure 9A:
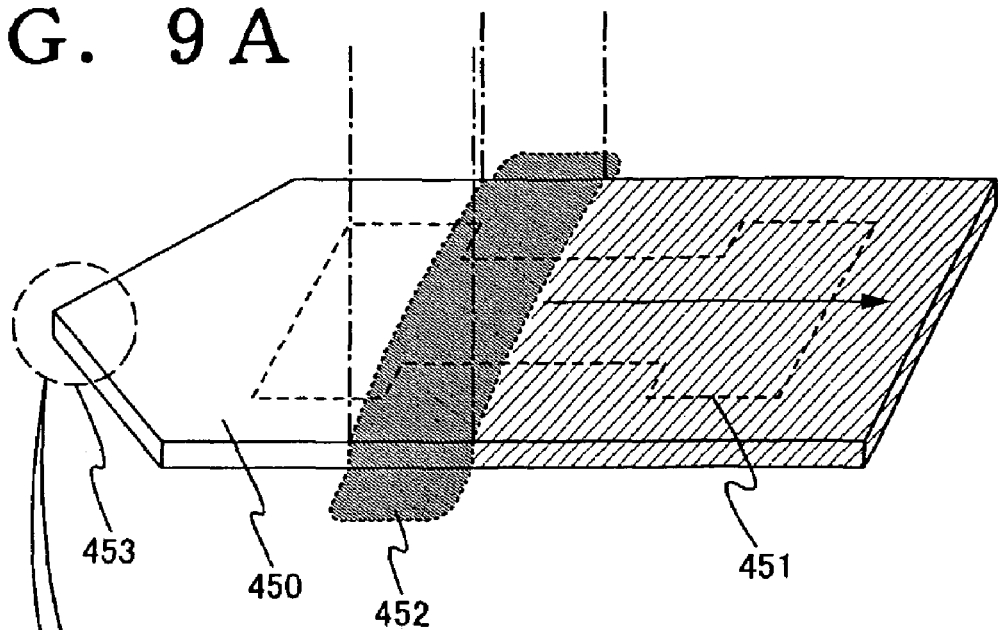
FIGS. 9A and 9B are diagrams showing positions at which an object is irradiated with laser light.

FIG. 9A shows an island-like semiconductor film 450 being irradiated with laser light for crystallization. The island-like semiconductor film 450 has an amorphous structure. The semiconductor material of 450 is not limited but silicon or an silicon germanium (SiGe) alloy is preferred.

A broken line 451 indicates the position of an active layer of a TFT which is obtained by patterning the island-like semiconductor film 450 that has been crystallized by laser annealing. A laser light irradiation position 452 is moved along the channel moving direction or the opposite direction.

Figure 9B:
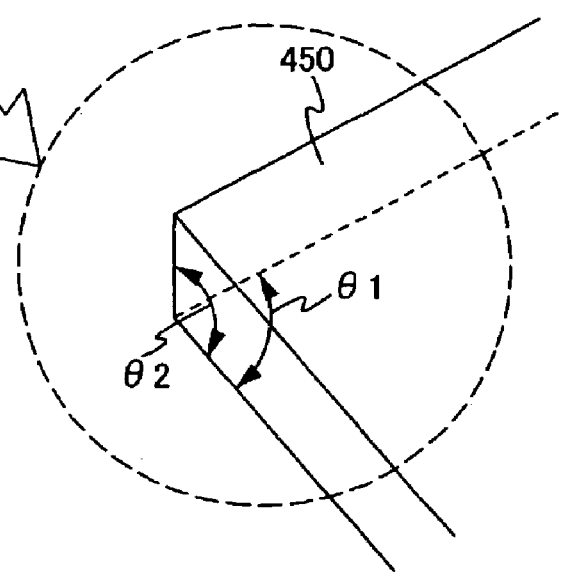

FIG. 9B shows an enlarged view of a portion 453 that is irradiated with laser light first in the island-like semiconductor film 450. In this embodiment, laser light irradiation is started intentionally from the edge of the island-like semiconductor film. The term 'edge' refers to a portion that includes the corner of the island-like semiconductor film when the film is viewed from the direction in which laser light is radiated.

In FIG. 9B, an edge angle θ1 viewed from the direction in which laser light is radiated is less than 180°. An angle θ2 of a side face of the island-like semiconductor film 450 with respect to the insulating surface is set to 90±10°, preferably 90±5°.

As laser light irradiation is started from the edge of the island-like semiconductor film 450, crystals having (100) orientation begin to grow from the edge. As irradiation of the island-like semiconductor film 450 with laser light is completed, the (100) orientation ratio can be enhanced throughout the island-like semiconductor film 450.

With the (100) orientation ratio of a semiconductor film enhanced, the mobility of a TFT in which the semiconductor film is used for the active layer can be improved. Heightened (100) orientation ratio of a semiconductor film can also reduce fluctuation in quality between gate insulating films formed thereon and can accordingly reduce fluctuation in threshold voltage between TFTs.

When the substrate is irradiated with laser light by the laser apparatus of the present invention, the laser light track forms not exactly a straight line but a gentle arc. However, island-like semiconductor films are small in size compared to the radii of the arcs and therefore the traces of laser light irradiation that are left in the island-like semiconductor films are generally linear.

Next, a description is given on an example of applying the above-described method of crystallizing a semiconductor film to a method of manufacturing an active matrix semiconductor display device that has a driving circuit and a pixel portion on the same substrate.

Figure 23A:
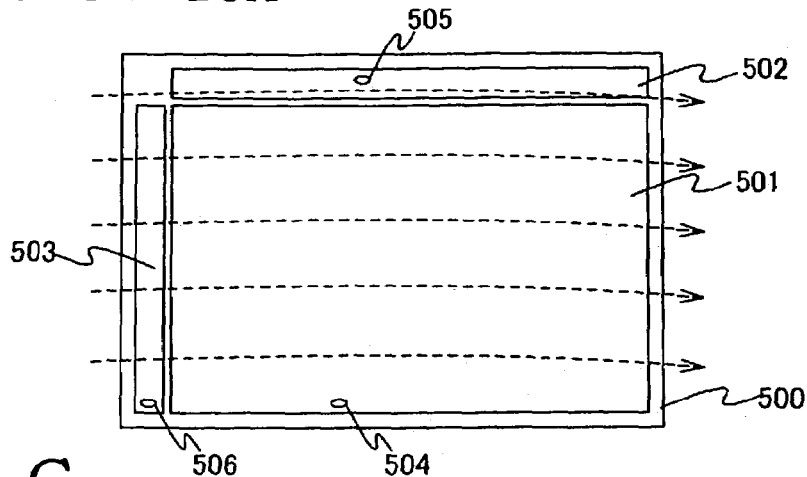
FIGS. 23A to 23D are diagrams showing a method of irradiating a liquid crystal panel with laser light.

FIG. 23A is a top view of a liquid crystal panel having a pixel portion 501, a signal line driving circuit 502, and a scanning line driving circuit 503 on a substrate 500. In FIG. 23A, the laser light irradiation position moves in a direction indicated by an arrow of broken line.

Figure 23B:
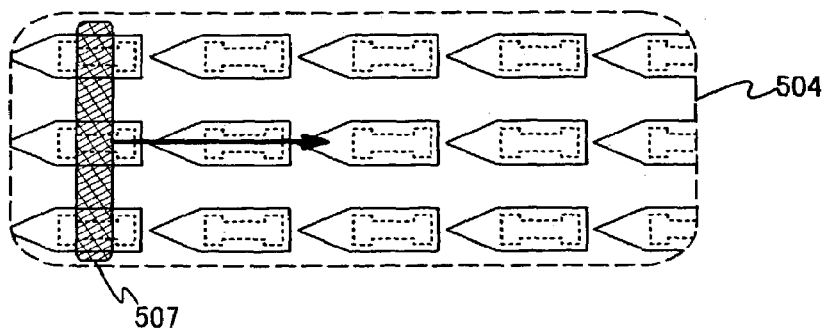
Figure 23C:
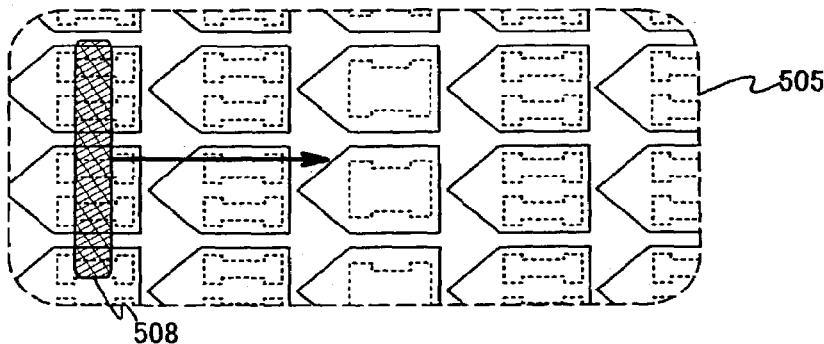
Figure 23D:
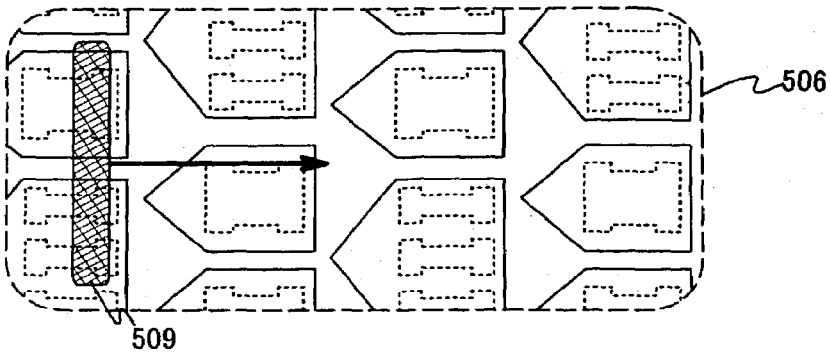

A part of the pixel portion 501 of FIG. 23A is denoted by reference numeral 504 and is enlarged in FIG. 23B. A part of the signal line driving circuit 502 of FIG. 23A is denoted by reference numeral 505 and is enlarged in FIG. 23C. A part of the scanning line driving circuit 503 of FIG. 23A is denoted by reference numeral 506 and is enlarged in FIG. 23D.

Plural island-like semiconductor films to serve as active layers of TFTs are formed in each of the pixel portion 501, signal line driving circuit 502, and scanning line driving circuit 503. Regions denoted by reference numerals 507, 508, and 509 are irradiated with laser light and each of them is moved in the direction indicated by the arrow.

The island-like semiconductor films are positioned such that each film is irradiated with laser light starting from its edge.

The sizes and shapes of the island-like semiconductor films are determined by the shapes of TFTs to be formed in the pixel portion 501, signal line driving circuit 502, and scanning line driving circuit 503. Alternatively, active layers of plural TFTs may be formed from one island-like semiconductor film.

This embodiment may be combined with Embodiments 1 to 4.

Embodiment 6

This embodiment describes a laser light oscillator and other optical system for use in the laser apparatus of the present invention.

Figure 10:
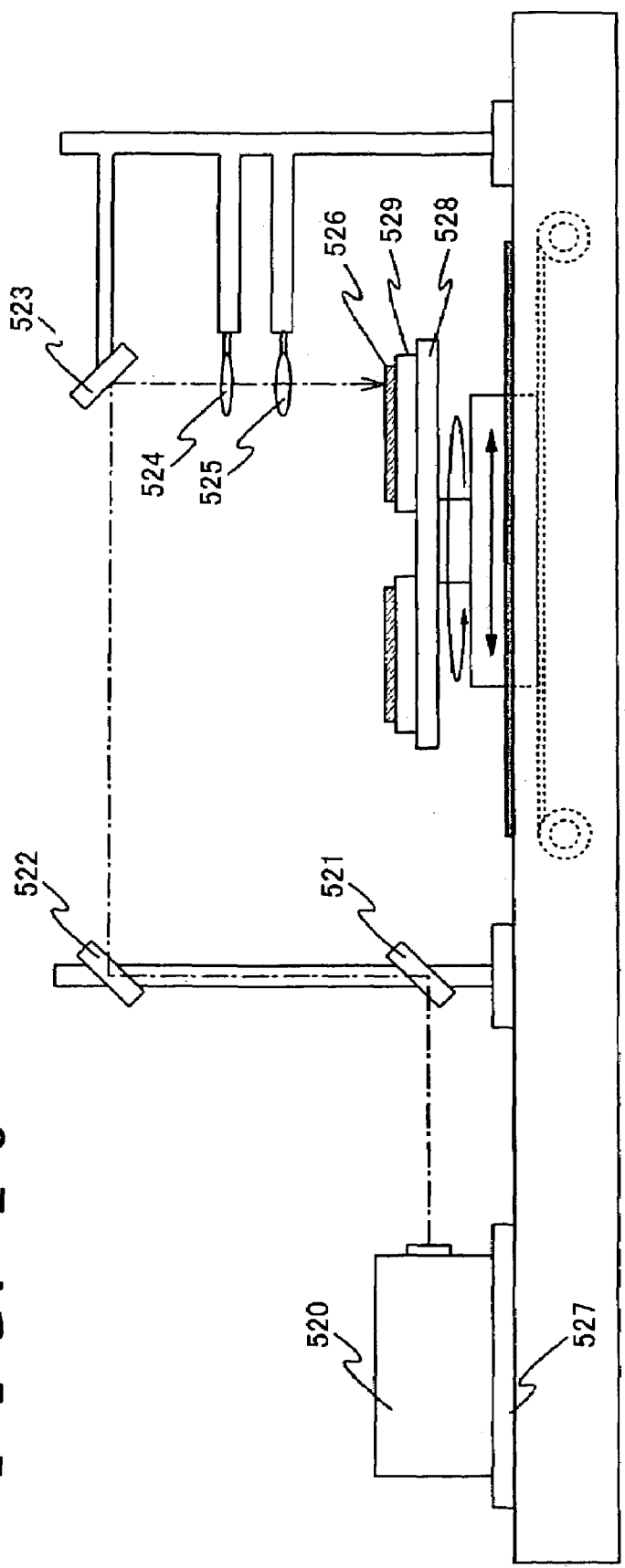
FIG. 10 is a diagram showing the structure of laser apparatus according to the present invention.

FIG. 10 shows the structure of laser apparatus of this embodiment. Denoted by reference numeral 520 is a laser light oscillator of continuous wave type or pulse oscillation type. The oscillator 520 uses a chiller 527 to keep its temperature constant. The chiller 527 is not always necessary. However, fluctuation in energy of laser light outputted from the oscillator due to a change in temperature of the oscillator can be avoided by keeping the temperature of the oscillator 520 constant.

Laser light outputted from the oscillator 520 reaches fixed mirrors 521, 522, and 523 to change its light path and is then collected by lenses 524 and 525 that are collimator lenses or cylindrical lenses to irradiate a process object 526 set on a stage 528. The number of optical systems is not limited and it is sufficient if the optical system has means to irradiate a process object with laser light at a fixed position and a fixed angle.

Laser light radiated onto a process object is reflected at the surface and reenters the optical system. This could cause damage to the laser oscillator and therefore it is desirable to make laser light enter a process object at a given angle.

As described in Embodiment Mode, the stage 528 is rotated on a rotating base 529 while moving the rotation center along a straight line. In this way, the laser light irradiation position on the process object 526 can be moved so that the entire surface of the process object 526 is processed.

This embodiment may be combined with Embodiments 1 to 5.

Embodiment 7

This embodiment describes a laser light oscillator and other optical system for use in the laser apparatus of the present invention.

Figure 11:
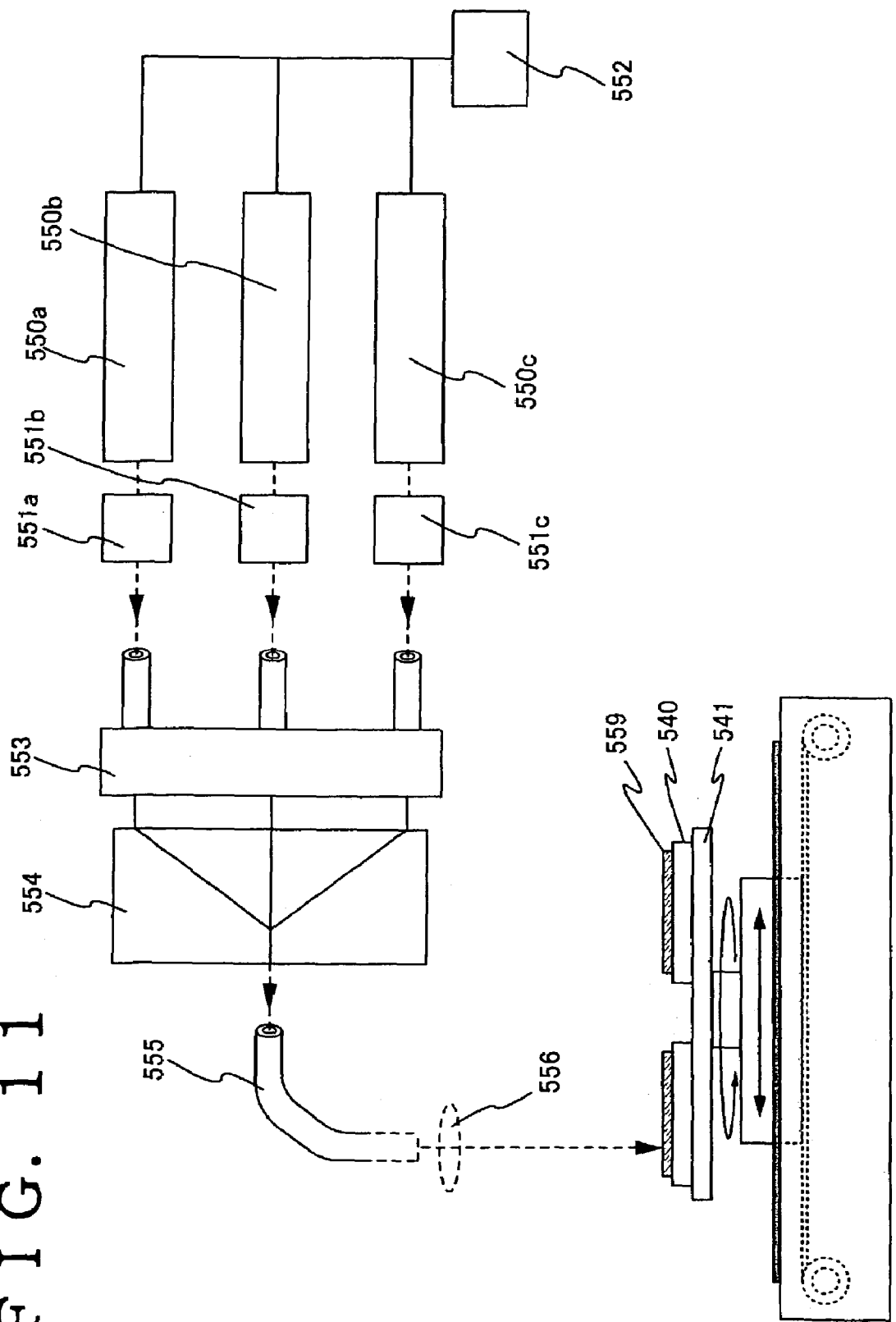
FIG. 11 is a diagram showing the structure of laser apparatus according to the present invention.

FIG. 11 shows the structure of laser apparatus of this embodiment. The laser apparatus of this embodiment uses a plurality of laser oscillators and plural laser beams outputted from the plural oscillators are synthesized into one. This embodiment takes as an example a case of using three oscillators 550 (550a, 550b, and 550c).

Laser light output of the oscillators can be controlled freely by a control device 552. Laser light outputted from at least one out of the three oscillators 550 is converted into second harmonic, third harmonic, or fourth harmonic by a non-linear optical element. In this embodiment, non-linear optical elements 551a, 551b, and 551c convert wavelengths of laser light outputted from the oscillators 550a, 550b, and 550c, respectively. The wavelengths of the laser light may be converted into the same wavelength or different wavelengths.

Laser beams outputted from the three oscillators 550 are synthesized into one. Specifically, in this embodiment, the laser beams are led through their respective fiber arrays 553 into a waveguide 554 to be synthesized into one laser beam. This may be achieved by a thin film polarizer (TFP) or other polarizers.

The laser light synthesized through the waveguide 554 is again led into an optical fiber 555 to reduce diffusion of the laser light. The laser light that has left the optical fiber 555 is collected by a convex lens 556 and reaches a process object 559 set on a stage 540.

The laser light synthesized into one has an energy density corresponding to that of laser light outputted from a high power laser. In addition, in laser light obtained by synthesizing plural laser beams, the beams compensate one another and can reduce interference since laser beams outputted from different lasers do not interfere one another unlike laser beams outputted from the same laser which are highly interfering. A non-linear optical element used to convert laser light into harmonic is required to transmit laser light and therefore has to have sufficient heat-resistance and durability. The non-linear optical element is degraded more as the power of laser becomes higher. Accordingly, a reduction in energy of laser light transmitted through the non-linear optical element leads to extension of lifetime of the non-linear optical element and to reduction in cost. The composition of this embodiment is that the wavelengths of the plural laser light are converted by the plural non-linear optical elements to be synthesized into one laser light. The composition can reduce the burden on one non-linear optical element rather than the composition that wavelength of one laser light is converted by the singular non-linear optical element. Therefore, each non-linear optical element can last much longer and its cost can be lowered.

The entire surface of a process object can be irradiated with the thus obtained laser light using an optical system such as an optical fiber, a galvanometer, or a polygon meter.

The shape of laser light on an irradiation surface varies among different kinds of lasers and it can be controlled by an optical system. For instance, the shape of laser light outputted from the XeCl excimer laser (wavelength: 308 nm, pulse width: 30 ns) L3308, a product of Lambda Physik, is rectangular and measures 10 mm×30 mm (both are half widths in beam profile). The shape of laser light outputted from a YAG laser is circular if the rod shape is cylindrical and is rectangular when the rod is shaped like a slab. If these shapes of laser light are changed by an optical system, laser light of desired size can be created.

When laser light enters a process object perpendicular to a substrate of the process object, a part of the laser light is reflected at the surface of the substrate and becomes returning light, which travels back the same light path it used to enter the object. The returning light affects the laser apparatus to cause fluctuation in output and frequency of laser and damage to the rod. Therefore it is preferable to provide an isolator to remove returning light and stabilize laser oscillation.

Alternatively, returning light can be avoided by making laser light enter the substrate at an angle. Since laser light is highly directional and has high energy density, the reflected light is preferably absorbed by a damper to prevent the reflected light from irradiating an area that should not be irradiated. Cooling water is circulated in the damper to avoid a temperature rise of the damper due to absorption of reflected light.

As described in Embodiment Mode, the stage 540 is rotated on a rotating base 541 while moving the rotation center along a straight line. This way the laser light irradiation position on the process object 559 can be moved so that the entire surface of the process object 559 is processed.

This embodiment may be combined with Embodiments 1 to 5.

Embodiment 8

This embodiment describes a laser light oscillator and other optical system for use in the laser apparatus of the present invention.

Figure 12:
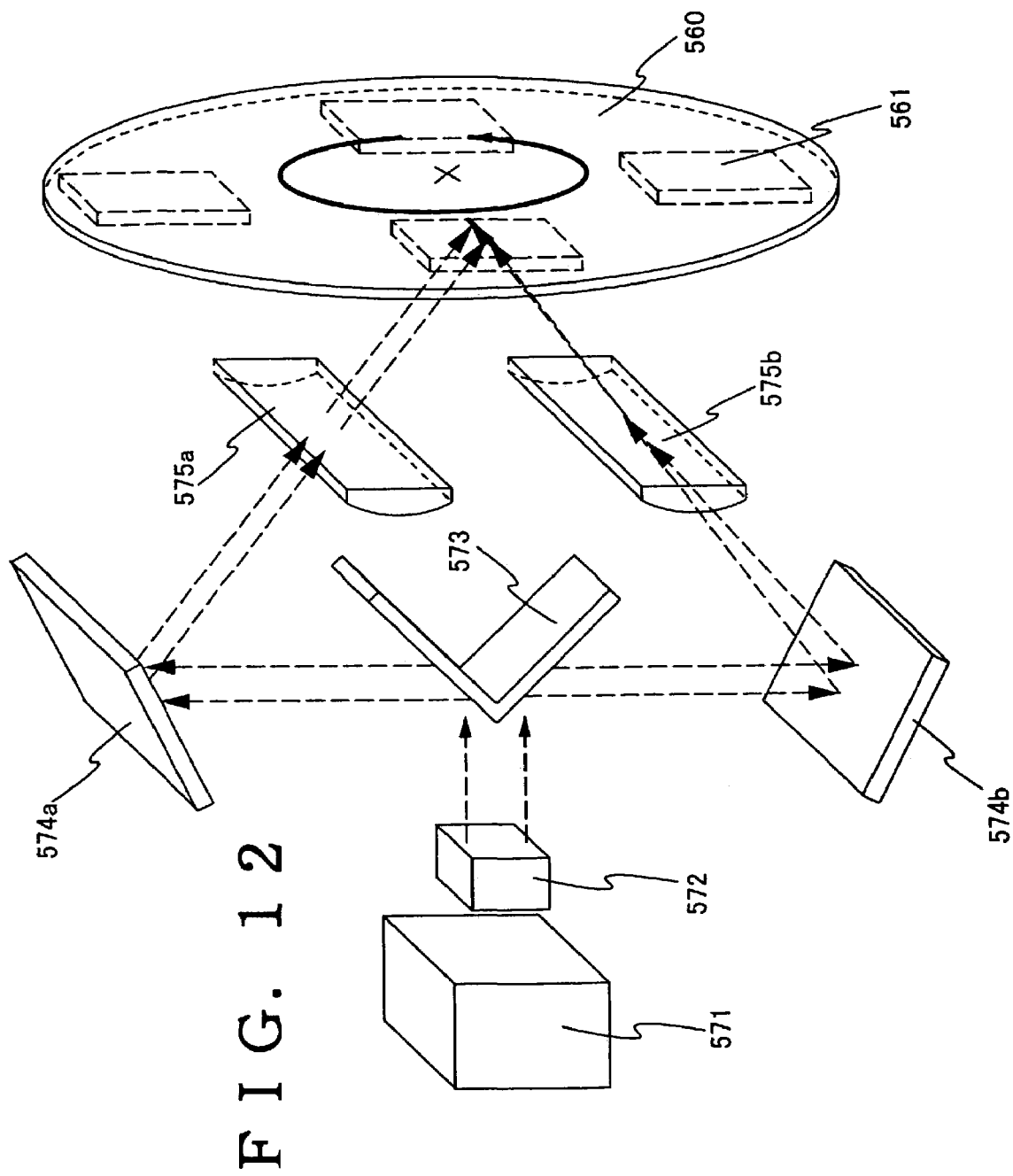
FIG. 12 is a diagram showing the structure of laser apparatus according to the present invention.

FIG. 12 shows the structure of laser apparatus of this embodiment. In the laser apparatus of this embodiment, laser light outputted from an oscillator 571 is converted into harmonic by a non-linear optical element 572 and split into plural laser beams by a mirror 573 that is a splitting means.

The laser beams are respectively reflected by mirrors 574a and 574b that are means for forming laser light having a periodic energy distribution. The reflected laser beams are respectively collected by cylindrical lenses 575a and 575b and reach a process object 561 set on a stage (not shown in the drawing in this embodiment). The plural laser beams are synthesized in the process object 561, thereby causing interference and forming laser light that has a periodic energy distribution. The cylindrical lenses 575a and 575b are not always necessary but they can enhance the energy density in the irradiation surface.

The shape of laser light outputted from a laser varies depending on what kind the laser is. If the rod shape is cylindrical, the laser shape is circular whereas it is rectangular when the rod is shaped like a slab.

As described in Embodiment Mode, the stage is rotated on a rotating base 560 while moving the rotation center along a straight line. In this way, the laser light irradiation position on the process object 561 can be moved so that the entire surface of the process object 561 is processed.

This embodiment may be combined with Embodiments 1 to 5.

Embodiment 9

In this embodiment, a method of manufacturing an active matrix substrate will be described with reference to FIGS. 13 through 15. A substrate on which a CMOS circuit, a driver circuit, and a pixel portion having a pixel TFT and a holding capacity are formed together is called active matrix substrate for convenience.

First of all, a substrate 600 formed of glass such as barium borosilicate glass and aluminum borosilicate glass is used in this embodiment. The substrate 600 may be a quartz substrate, a silicon substrate, a metal substrate or stainless substrate, which has an insulating film on the surface. The substrate 600 may be a plastic substrate having heat resistance, which withstands a processing temperature in this embodiment.

Next, a base film 601 having an insulating film such as silicon oxide film, silicon nitride film, and a silicon oxynitride film is formed on the substrate 600 by publicly known method (such as the sputtering method, LPCVD method and plasma CVD method). In this embodiment, a two-layer structure is used for the base film 601. However, a structure may be used where a single layer film, which is the insulating film itself, or at least two layers are stacked.

Next, semiconductor layers 602 to 606 are formed on the base film 600. First of all, semiconductor layers 602 to 606 are formed with a thickness of 25 to 80 nm (preferably 30 to 60 nm) by publicly known method (such as the sputtering method, LPCVD method and plasma CVD method). Then, the semiconductor film is crystallized by laser crystallization method. The laser crystallization method is performed by using the laser apparatus of the present invention. Of course, in addition to the laser crystallization method, the semiconductor film may be crystallized by combining other publicly known crystallization method (such as thermal crystallization method using RTA or a furnace annealing and thermal crystallization method using a metal element facilitating the crystallization). Patterning is performed on the obtained crystalline semiconductor film in a desired shape in order to form the semiconductor layers 602 to 606. The semiconductor film may be an amorphous semiconductor film, a fine crystal semiconductor film or a crystalline semiconductor film. Alternatively, the semiconductor film may be a compound semiconductor film having an amorphous structure such as an amorphous silicon germanium film.

As a laser oscillation device, excimer laser of pulse oscillation type or continuous emission type or YAG laser, $YVO_4$ laser are used. While the conditions for crystallization are selected appropriately by operator, pulse oscillation frequency is set at 300 Hz and a laser energy density is set at 100 to 400 mJ/cm$^2$ (typically, at 200 to 300 mJ/cm$^2$) in the case of using an excimer laser. Alternatively, in the case of using a YAG laser, it is preferable to use the second higher harmonic wave while the pulse oscillation frequency is set at 30 to 300 kHz with the laser energy density being set at 300 to 600 mJ/cm$^2$ (typically 350 to 500 mJ/cm$^2$). It may be performed to irradiate linearly corrected laser light with a width of 100 to 1000 μm, e.g., 400 μm, over the entire surface of the substrate while the overlapping ratio of linear laser lights at this time is set at 50 to 90%.

Note that, a gas laser or solid-state laser of continuous oscillation type or pulse oscillation type can be used. The gas laser such as an excimer laser, Ar laser, Kr laser and the solid-state laser such as YAG laser, $YVO_4$ laser, YLF laser, $YAlO_3$ laser, glass laser, ruby laser, alexandrite laser, Ti: sapphire laser, $Y_2O_3$ laser can be used as the laser light. Also, crystals such as YAG laser, $YVO_4$ laser, YLF laser, $YAlO_3$ laser wherein Cr, Nd, Er, Ho, Ce, Co, Ti, Yb or Tm is doped can be used as the solid-state laser. A basic wave of the lasers is different depending on the materials of doping, therefore a laser light having a basic wave of approximately 1 μm is obtained. A harmonic corresponding to the basic wave can be obtained by the using non-linear optical elements.

When a crystallization of an amorphous semiconductor film is conducted, it is preferable that the second harmonic through the fourth harmonic of basic waves is applied by using the solid state laser which is capable of continuous oscillation in order to obtain a crystal in large grain size. Typically, it is preferable that the second harmonic (with a thickness of 532 nm) or the third harmonic (with a thickness of 355 nm) of an Nd: $YVO_4$ laser (basic wave of 1064 nm) is applied. Specifically, laser lights emitted from the continuous oscillation type $YVO_4$ laser with 10 W output are converted into a harmonic by using the non-linear optical elements. Also, a method of emitting a harmonic by applying crystal of $YVO_4$ and the non-linear optical elements into a resonator. Then, more preferably, the laser lights are formed so as to have a rectangular shape or an elliptical shape by an optical system, thereby irradiating a process object. At this time, the energy density of approximately 0.01 to 100 MW/cm$^2$ (preferably 0.1 to 10 MW/cm$^2$) is required. The semiconductor film is moved at approximately 10 to 2000 cm/s rate relatively corresponding to the laser lights so as to irradiate the semiconductor film.

The semiconductor layers 602 to 606 are formed by performing patterning processing thereon using a photolithography method.

After the semiconductor layers 602 to 606 are formed, a small amount of impurity element (boron or phosphorus) may be doped in order to control a threshold value of the TFT.

Next, a gate insulating film 607 covering the semiconductor layers 602 to 606 is formed. The gate insulating film 607 is formed by using an insulating film containing silicon with a thickness of 40 to 150 nm by using plasma CVD method or sputtering method. In this embodiment, a silicon oxynitride film (compositional ratio: Si=32%, O=59%, N=7% and H=2%) with a thickness of 110 nm is formed by the plasma CVD method. Notably, the gate insulating film is not limited to the silicon oxynitride film but an insulating film containing other silicon may be used as a single layer or as a laminated pad.

When a silicon oxide film is used, it is formed by mixing Tetraethyl Orthosilicate (TEOS) and $O_2$ by plasma CVD method, which is discharged under a condition with reaction pressure of 40 Pa, a substrate temperature of 300 to 400° C. and high frequency (13.56 MHz) power density of 0.5 to 0.8 W/cm$^2$. Thermal annealing at 400 to 500° C. thereafter can give good characteristics to the silicon oxide film produced in this way as a gate insulating film.

Next, a first conductive film 608, which is 20 to 100 nm in thickness, and a second conductive film 609, which is 100 to 400 nm in thickness, is stacked on the gate insulating film 607. In this embodiment, the first conductive film 608 formed by a TaN film with a thickness of 30 nm and the second conductive film 609 formed by a W film with a thickness of 370 nm are stacked. The TaN film is formed by using Ta target to perform sputtering in an atmosphere containing nitrogen. The W film is formed by using W target to perform sputtering. Alternatively, it can be formed by thermal CVD method using tungsten hexafluoride ($WF_6$). In both cases, the use of the gate electrode needs low resistance. Therefore, the resistivity of the W film is desirably 20 μΩcm or less. The low resistance of the W film can be achieved by increasing the size of the crystal grains. However, when the W film contains a large amount of impurity element such as oxygen, the crystallization is inhibited, which raises the resistance. Accordingly, in this embodiment, the W film is formed by the sputtering method using high purity (purity of 99.9999%) W target and by taking the prevention of intrusion of impurity from a vapor phase during the film forming into special consideration. Thus, the resistivity of 9 to 20 μΩcm can be achieved.

While, in this embodiment, the first conductive film 608 is TaN and the second conductive film 609 is W, they are not limited in particular Both of them can be formed by an element selected from Ta, W, Ti, Mo, Al, Cu, Cr and Nd or an alloy material or a compound material mainly containing the element. Alternatively, a semiconductor film, such as a polycrystalline silicon film to which an impurity element such as phosphorus is doped, can be used. An AgPdCu alloy may be used. A combination of the first conductive film formed by a tantalum (Ta) film and the second conductive film formed by a W film, a combination of the first conductive film formed by a titan nitride (TiN) film and the second conductive film formed by a W film, a combination of the first conductive film formed by a tantalum nitride (TaN) film and the second conductive film formed by a W film, a combination of the first conductive film formed by a tantalum nitride (TaN) film and the second conductive film formed by an Al film, or a combination of the first conductive film formed by a tantalum nitride (TaN) film and the second conductive film formed by a Cu film is possible.

Further, the present invention is not limited to a two-layer structure. For example, a three-layer structure may be adopted in which a tungsten film, an alloy film of aluminum and silicon (Al—Si), and a titanium nitride film are sequentially laminated. Moreover, in case of a three-layer structure, tungsten nitride may be used in place of tungsten, an alloy film of aluminum and titanium (Al—Ti) may be used in place of the alloy film of aluminum and silicon (Al—Si), and a titanium film may be used in place of the titanium nitride film.

Note that, it is important that appropriate etching method or kinds of etchant is properly selected depending on the materials of a conductive film.

Next, masks 610 to 615 made of resist using photolithography method are formed, and first etching processing is performed thereon in order to form electrodes and wires. The first etching processing is performed under first and second etching conditions (FIG. 13B). The first etching condition in this embodiment is to use Inductively Coupled Plasma (ICP) etching and to use $CF_4$ and $Cl_2$ and $O_2$ as an etching gas, whose amount of gases are 25/25/10 (sccm), respectively. 500 W of RF (13.56 MHz) power was supplied to a coil type electrode by 1 Pa pressure in order to generate plasma and then to perform etching. 150 W of RF (13.56 MHz) power was also supplied to a substrate side (test sample stage) and substantially negative self-bias voltage was applied. The W film was etched under the first etching condition so as to obtain the end of the first conductive layer in a tapered form.

After that, the first etching condition is shifted to the second etching condition without removing the masks 610 to 615 made of resist. Then, $CF_4$ and $Cl_2$ are used as etching gases. The ratio of the amounts of flowing gasses is 30/30 (sccm). 500 W of RF (13.56 MHz) power is supplied to a coil type electrode by 1 Pa pressure in order to generate plasma and then to perform etching for amount 30 seconds. 20 W of RF (13.56 MHz) power is also supplied to a substrate side (test sample stage) and substantially negative self-bias voltage is applied. Under the second etching condition where $CF_4$ and $Cl_2$ are mixed, both W film and TaN film were etched to the same degree. In order to etch without leaving a residue on the gate insulating film, the etching time may be increased 10 to 20% more.

In the first etching processing, when the shape of the mask made of resist is appropriate, the shape of the ends of the first and the second conductive layers are in the tapered form due to the effect of the bias voltage applied to the substrate side. The angle of the tapered portion is 15 to 45°. Thus, conductive layers 617 to 622 in a first form are formed which include the first conductive layers and the second conductive layers (first conductive layers 617a to 622a and second conductive layer 617b to 622b) through the first etching processing. In a gate insulating film 616, an area not covered by the conductive layers 617 to 622 in the first form is etched by about 20 to 50 nm so as to form a thinner area.

Next, second etching processing is performed without removing masks made of resist (FIG. 13C). Here, $CF_4$, $Cl_2$ and $O_2$ are used as an etching gas to etch the W film selectively. Then, second conductive layers 628b to 633b are formed by the second etching processing. On the other hand, the first conductive layers 617a to 622a are not etched very much, and conductive layers 628 to 633 in the second form are formed.

First doping processing is performed without removing masks made of resist and low density of impurity element, which gives n-type to the semiconductor layer, is added. The doping processing may be performed by the ion-doping method or the ion-implanting method. The ion doping method is performed under a condition in the dose of $1 \times 10^{13}$ to $5 \times 10^{14}/cm^2$ and the accelerating voltage of 40 to 80 kV. In this embodiment, the ion doping method is performed under a condition in the dose of $1.5 \times 10^{13}/cm^2$ and the accelerating voltage of 60 kV. The n-type doping impurity element may be Group 15 elements, typically phosphorus (P) or arsenic (As). Here, phosphorus (P) is used. In this case, the conductive layers 628 to 633 function as masks for the n-type doping impurity element. Therefore, impurity areas 623 to 627 are formed in the self-alignment manner. An n-type doping impurity element in the density range of $1 \times 10^{18}$ to $1 \times 10^{20}$ atoms/$cm^3$ are added to the impurity areas 623 to 627.

When masks made of resist are removed, new masks 634a to 634c made of resist are formed. Then, second doping processing is performed by using higher accelerating voltage than that used in the first doping processing. The ion doping method is performed under a condition in the dose of $1 \times 10^{13}$ to $1 \times 10^{15}/cm^2$ and the accelerating voltage of 60 to 120 kV. In the doping processing, the second conductive layers 628b to 632b are used as masks against the impurity element. Doping is performed such that the impurity element can be added to the semiconductor layer at the bottom of the tapered portion of the first conductive layer. Then, third doping processing is performed by having lower accelerating voltage than that in the second doping processing to obtain a condition shown in FIG. 14A. The ion doping method is performed under a condition in the dose of $1 \times 10^{15}$ to $1 \times 10^{17}/cm^2$ and the accelerating voltage of 50 to 100 kV. Through the second doping processing and the third doping processing, an n-type doping impurity element in the density range of $1 \times 10^{18}$ to $5 \times 10^{19}$ atoms/$cm^3$ is added to the low density impurity areas 636, 642 and 648, which overlap with the first conductive layer. An n-type doping impurity element in the density range of $1\times10^{19}$ to $5\times10^{21}$ atoms/cm$^3$ is added to the high density impurity areas 635, 641, 644 and 647.

With proper accelerating voltage, the low density impurity area and the high density impurity area can be formed by performing the second doping processing and the third doping processing once.

Next, after removing masks made of resist, new masks 650a to 650c made of resist are formed to perform the fourth doping processing. Through the fourth doping processing, impurity areas 653, 654, 659 and 660, to which an impurity element doping a conductive type opposite to the one conductive type is added, in a semiconductor layer, which is an active layer of a p-channel type TFT. Second conductive layers 628a to 632a are used as mask against the impurity element, and the impurity element giving p-type is added so as to form impurity areas in the self-alignment manner. In this embodiment, the impurity areas 653, 654, 659 and 660 are formed by applying ion-doping method using diborane ($B_2H_6$) (FIG. 14B). During the fourth doping processing, the semiconductor layer forming the n-channel TFT is covered by masks 650a to 650c made of resist. Thorough the first to the third doping processing, phosphorus of different densities is added to each of the impurity areas 653, 654, 659, and 660. Doping processing is performed such that the density of p-type doping impurity element can be $1\times10^{19}$ to $5\times10^{21}$ atoms/cm$^3$ in both areas. Thus, no problems are caused when they function as the source region and the drain region of the p-channel TFT.

Impurity areas are formed in the semiconductor layers, respectively, through the processes above.

Next, the masks 650a to 650c made of resist are removed and a first interlayer insulating film 661 is formed thereon. The first interlayer insulating film 661 may be an insulating film with a thickness of 100 to 200 nm containing silicon, which is formed by plasma CVD method or sputtering method. In this embodiment, silicon oxynitride film with a thickness of 150 nm is formed by plasma CVD method. The first interlayer insulating film 661 is not limited to the silicon oxynitride film but may be the other insulating film containing silicon in a single layer or in a laminated pad.

Next, as shown in FIG. 14C, activation processing is performed by using laser irradiation method. When a laser annealing method is used, the laser used in the crystallization can be used. When the activation processing is performed, the moving speed is same as the crystallization, and an energy density of about 0.01 to 100 MW/cm$^2$ (preferably, 0.01 to 10 MW/cm$^2$) is required. Also, a continuous oscillation laser may be used in the case the crystallization is performed and a pulse oscillation laser may be used in the case the activation is performed.

Also, the activation processing may be conducted before the first interlayer insulating film is formed.

After the heating processing (thermal processing at 300 to 550° C. for 1 to 12 hours) is performed, hydrogenation can be performed. This process terminates the dangling bond of the semiconductor layer with hydrogen contained in the first interlayer insulating film 661. The semiconductor layer can be hydrogenated regardless of the existence of the first interlayer insulating film. Alternatively, the hydrogenation may be plasma hydrogenation (using hydrogen excited by plasma) or heating processing in an atmosphere containing 3 to 100% of hydrogen at 300 to 650° C. for 1 to 12 hours.

Next, a second interlayer insulating film 662 formed by an inorganic insulating material or an organic insulator material is formed on the first interlayer insulating film 661. In this embodiment, an acrylic resin film with a thickness of 1.6 μm is formed, whose viscosity is 10 to 1000 cp, preferably 40 to 200 cp and which has depressions and projections formed on the surface.

In this embodiment, in order to prevent mirror reflection, a second interlayer insulating film having projections and depressions on the surface is formed. Thus, the projections and depressions are formed on the surface of the pixel electrode. In order to obtain an effect of light dispersion by forming the depressions and projections on the surface of the pixel electrode, a projecting portion may be formed under the pixel electrode. In this case, the projecting portion can be formed by using the same photomask for forming a TFT. Thus, the projecting portion can be formed without any increase in the number of steps. The projecting portion may be provided as necessary on the substrate in the pixel area except for wirings and the TFT portion. Accordingly, projections and depressions can be formed on the surface of the pixel electrode along the projections and depressions formed on the surface of an insulating film covering the projecting portion.

Alternatively, the second interlayer insulating film 662 may be a film having a flattened surface. In this case, after the pixel electrode is formed, projections and depressions are formed on the surface by performing an added process such as publicly known sand-blast method and etching method or the like. Preferably, by preventing mirror reflection and by dispersing reflected light, the whiteness is increased.

Wirings 663 to 667 electrically connecting to impurity areas, respectively, are formed in a driver circuit 686. These wirings are formed by patterning a film laminating a Ti film with a thickness of 50 nm and an alloy film (alloy film of Al and Ti) with a thickness of 500 nm. It is not limited to the two-layer structure but may be a one-layer structure or a laminate pad including three or more layers. The materials of the wirings are not limited to Al and Ti. For example, the wiring can be formed by forming Al or Cu on a TaN film and then by patterning the laminate film in which a Ti film is formed (FIG. 15).

In a pixel portion 687, a pixel electrode 670, a gate wiring 669 and a connecting electrode 668 are formed. Source wirings (a laminate of layers 633a and 633b) are electrically connected with a pixel TFT by the connecting electrode 668. The gate wiring 669 is electrically connected with a gate electrode of the TFT pixel. A pixel electrode 670 is electrically connected with a drain region 642 of the pixel TFT. Furthermore, the pixel electrode 670 is electrically connected with a semiconductor layer 659 functioning as one electrode forming a storage capacitor. Desirably, a material having excellent reflectivity such as a film mainly containing Al or Ag or the laminate film is used for the pixel electrode 670.

In this way, the driver circuit 686 having a CMOS circuit including an n-channel TFT 681 and a p-channel TFT 682 and a n-channel TFT 683, and the pixel portion 687 having the pixel TFT 684 and the storage capacitor 685 can be formed on the same substrate. Thus, an active matrix substrate is completed.

The n-channel TFT 681 of the driver circuit 686 has a channel forming region 637, a low density impurity area 636 overlapping with the first conductive layer 628a, which constructs a part of the gate electrode (GOLD area), a high density impurity area 652 functioning as the source region or the drain region, and an impurity region 690 introduced impurity elements imparting an n-type. The p-type channel TFT 682 forming a CMOS circuit together with the n-channel TFT 681, which are connected by an electrode 666, has a channel forming region 640, a high density impurity area 653 functioning as the source region or the drain region, and an impurity area 654 to which a p-type doping impurity element are implanted. The n-channel TFT 683 has a channel forming region 643, a low density impurity area 642 overlapping with the first conductive layer 630a, which constructs a part of the gate electrode, (GOLD area), a high density impurity area 656 functioning as the source region or the drain region, and an impurity region 691 introduced an impurity element imparting an n-type.

The pixel TFT 684 of the pixel portion has a channel forming region 646, a low density impurity area 645 formed outside of the gate electrode (LDD region) and a high density impurity area 658 functioning as the source region or the drain region. An n-type doping impurity element and a p-type doping impurity element are added to a semiconductor layer functioning as one electrode of the storage capacitor 685. The storage capacitor 685 is formed by an electrode (a laminate of layers 632a and 632b) and a semiconductor layer by using the insulating film 616 as a dielectric.

The pixel structure in this embodiment is arranged such that light can be blocked in a space between pixel electrodes and the ends of the pixel electrodes can overlap with the source wiring without using the black matrix.

This embodiment can be implemented by combining with Embodiments 1 to 8.

Embodiment 10

Figure 16:
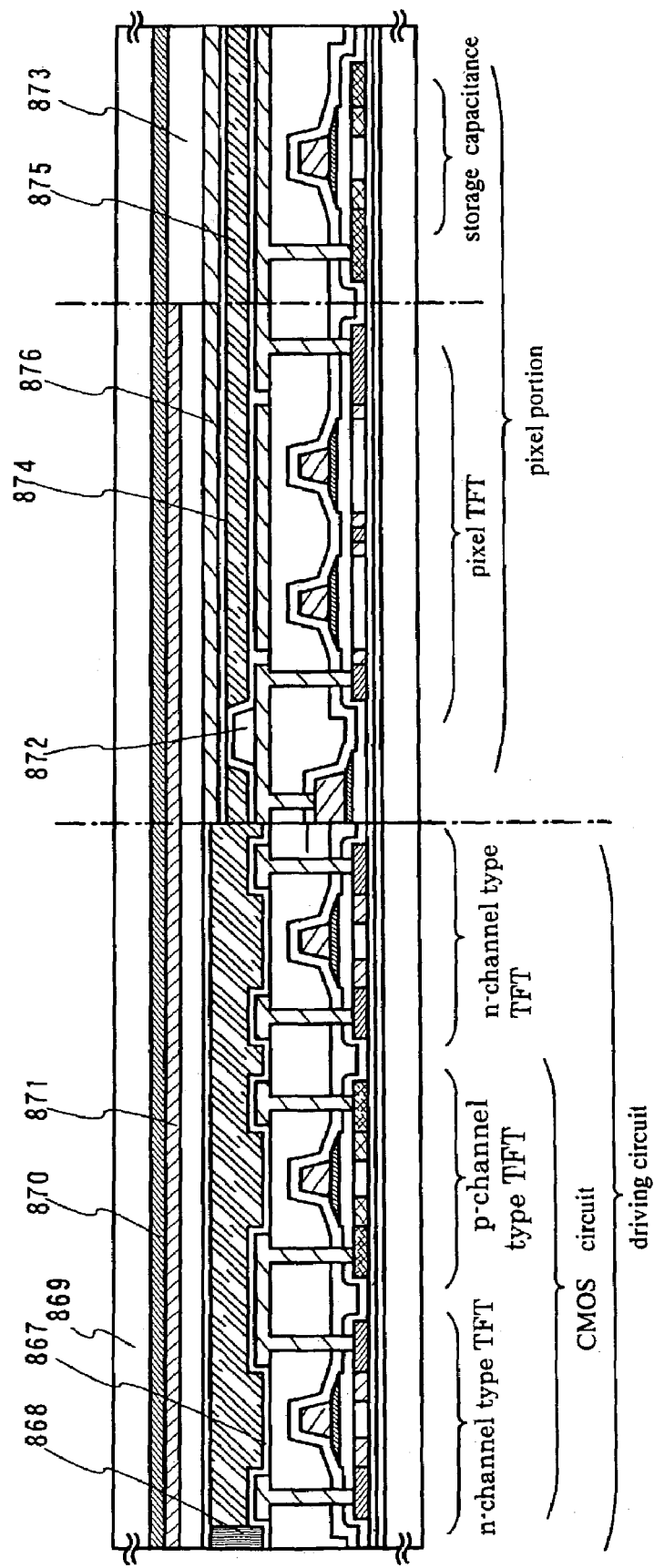
FIG. 16 is a diagram showing a method of manufacturing a semiconductor device using laser apparatus of the present invention.

This embodiment explains, below, a process to manufacture a reflection type liquid crystal display device from the active matrix substrate formed in Embodiment 9 with reference to FIG. 16.

Figure 15:
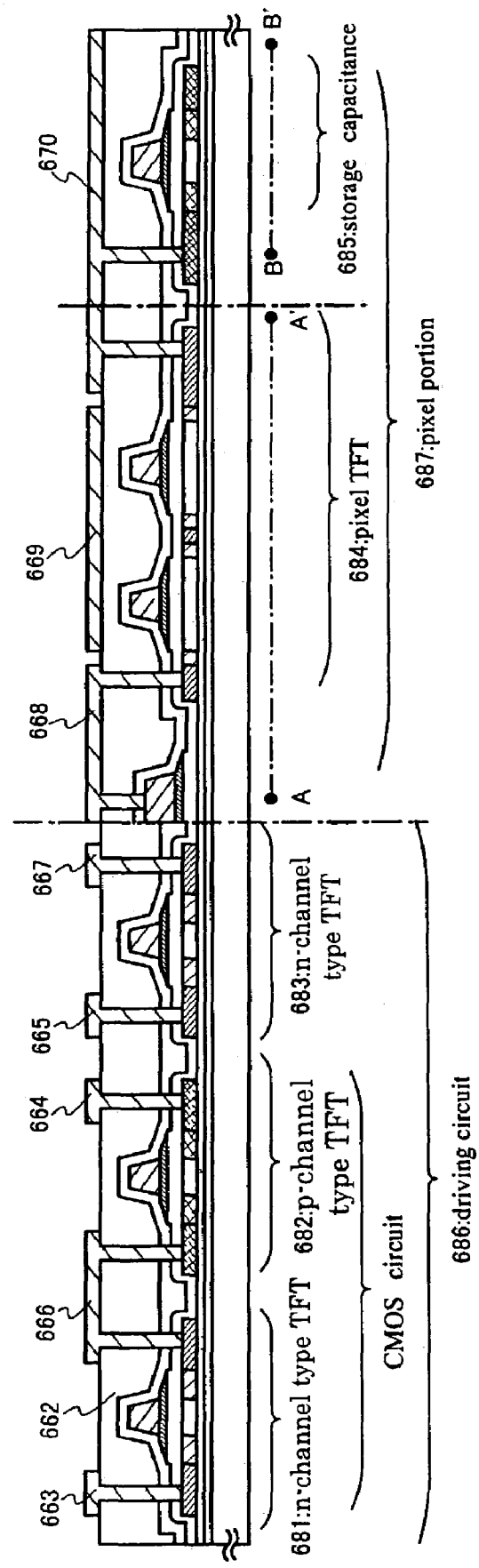
FIG. 15 is a diagram showing a method of manufacturing a semiconductor device using laser apparatus of the present invention.

First, after obtaining an active matrix substrate in the state of FIG. 15 according to Embodiment 9, an orientation film 867 is formed at least on the pixel electrodes 670 on the active matrix substrate of FIG. 15 and subjected to a rubbing process. Incidentally, in this embodiment, prior to forming an orientation film 867, an organic resin film such as an acryl resin film is patterned to form columnar spacers 872 in a desired position to support the substrates with spacing. Meanwhile, spherical spacers, in place of the columnar spacers, may be distributed over the entire surface of the substrate.

Then, a counter substrate 869 is prepared. Then, coloring layers 870, 871 and a planarizing film 873 are formed on a counter substrate 869. A shade portion is formed by overlapping a red coloring layer 870 and a blue coloring layer 871 together. Meanwhile, the shade portion may be formed by partly overlapping a red coloring layer and a green coloring layer.

In this embodiment is used a substrate shown in Embodiment 9. There is a need to shade at least the gap between the gate wiring 669 and the pixel electrode 670, the gap between the gate wiring 669 and the connecting electrode 668 and the gap between the connecting electrode 668 and the pixel electrode 670. In this embodiment were bonded together the substrates by arranging the coloring layers so that the shading portion having a lamination of coloring layers is overlapped with the to-be-shading portion.

In this manner, the gaps between the pixels are shaded by the shading portion having a lamination of coloring layers without forming a shading layer such as a black mask, thereby enabling to reduce the number of processes.

Then, a counter electrode 876 of a transparent conductive film is formed on the planarizing film 873 at least in the pixel portion. An orientation film 874 is formed over the entire surface of the counter substrate and subjected to a rubbing process.

Then, the active matrix substrate formed with the pixel portion and driver circuit and the counter substrate are bonded together by a seal member 868. The seal member 868 is mixed with filler so that the filler and the columnar spacers bond together the two substrates through an even spacing. Thereafter, a liquid crystal material 875 is poured between the substrates, and completely sealed by a sealant (not shown). The liquid crystal material 875 may be a known liquid crystal material. In this manner, completed is a reflection type liquid crystal display device shown in FIG. 16. If necessary, the active matrix substrate or counter substrate is divided into a desired shape. Furthermore, a polarizing plate (not shown) is bonded only on the counter substrate. Then, an FPC is bonded by a known technique.

The liquid crystal display device manufactured as above comprises TFT manufactured by a semiconductor film, wherein a laser light having a periodic or uniform energy distribution is irradiated and a crystal grain with a large grain size is formed. Thus, the liquid crystal display device ensures a good operational characteristic and high reliability. The liquid crystal display device can be used as a display portion for an electronic appliance in various kinds.

Incidentally, this embodiment can be implemented by combining with Embodiments 1 to 9.

Embodiment 11

This embodiment explains an example of manufacturing a light emitting device by using a method of manufacturing TFT when an active matrix substrate is fabricated in the Embodiment 9. In this specification, the light-emitting device refers, generally, to the display panel having light-emitting elements formed on a substrate sealed between the substrate and a cover member, and the display module having TFTs or the like mounted on the display panel. Incidentally, the light emitting element has a layer including an organic compound that electroluminescence caused is obtained by applying an electric field (light emitting layer), an anode layer and a cathode layer. Meanwhile, the electroluminescence in compound includes the light emission upon returning from the singlet-excited state to the ground state (fluorescent light) and the light emission upon returning from the triplet-excited state to the ground state (phosphorous light), including any or both of light emission.

Note that, all the layers that are provided between an anode and a cathode in a light emitting element are defined as an organic light emitting layer in this specification. Specifically, the organic light emitting layer includes a light emitting layer, a hole injection layer, an electron injection layer, a hole transporting layer, an electron transporting layer, etc. A basic structure of a light emitting element is a laminate of an anode layer, a light emitting layer, and a cathode layer layered in this order. The basic structure can be modified into a laminate of an anode layer, a hole injection layer, a light emitting layer, and a cathode layer layered in this order, or a laminate of an anode layer, a hole injection layer, a light emitting layer, an electron transporting layer, and a cathode layered in this order.

Figure 17:
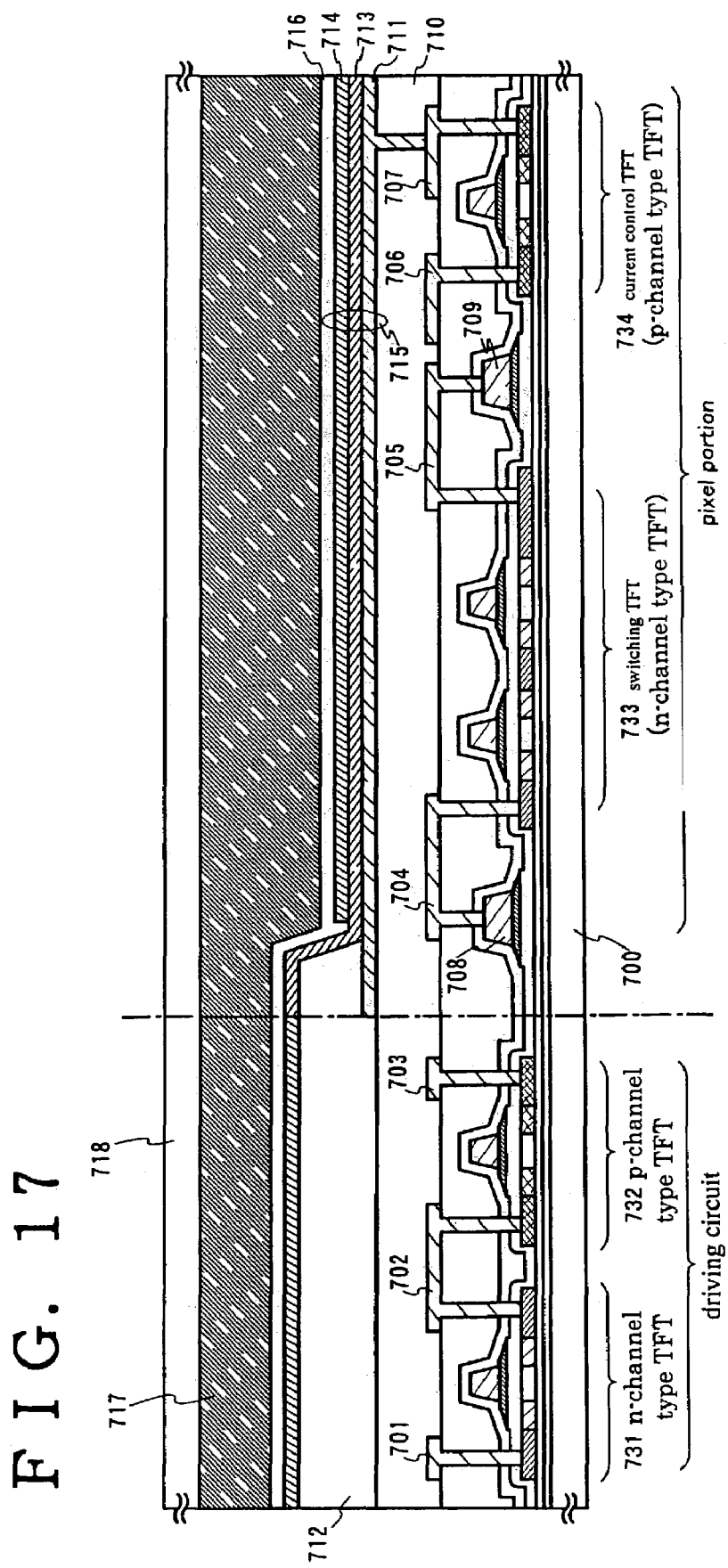
FIG. 17 is a diagram showing a method of manufacturing a semiconductor device using laser apparatus of the present invention.

FIG. 17 is a sectional view of a light-emitting device of this embodiment. In FIG. 17, the switching TFT 733 provided on the substrate 700 is formed by using the manufacturing method in Embodiment 9.

Incidentally, although this embodiment is of a double gate structure formed with two channel forming regions, it is possible to use a single gate structure formed with one channel forming region or a triple gate structure formed with three channel forming regions.

The driver circuit provided on the substrate 700 is formed by using the manufacturing method in Embodiment 9. Incidentally, although this embodiment is of a single gate structure, it is possible to use a double gate structure or a triple gate structure.

Meanwhile, the wirings 701, 703 serve as source wirings of the CMOS circuit while the wiring 702 as a drain wiring. Meanwhile, a wiring 704 serves as a wiring to electrically connect between the source wiring 708 and the source region of the switching TFT while the wiring 705 serves as a wiring to electrically connect between the drain wiring 709 and the drain region of the switching TFT.

Incidentally, a current control TFT 734 is formed by using the manufacturing method in Embodiment 9. Incidentally, although this embodiment is of a single gate structure, it is possible to use a double gate structure or a triple gate structure.

Meanwhile, the wiring 706 is a source wiring of the current control TFT (corresponding to a current supply line) while the wiring 707 is an electrode to be electrically connected to the pixel electrode 711 by being overlaid a pixel electrode 711 of the current control TFT.

Meanwhile, reference numeral 711 is a pixel electrode (anode of a light-emitting element) formed by a transparent conductive film. As the transparent conductive film can be used a compound of indium oxide and tin oxide, a compound of indium oxide and zinc oxide, zinc oxide, tin oxide or indium oxide. A transparent conductive film added with gallium may also be used. The pixel electrode 711 is formed on a planar interlayer insulating film 710 prior to forming the wirings. In this embodiment, it is very important to planarize the step due to the TFT by using a planarizing film 710 made of resin. A light emitting layer to be formed later, because being extremely thin, possibly causes poor light emission due to the presence of a step. Accordingly, it is desired to provide planarization prior to forming a pixel electrode so that a light emitting layer can be formed as planar as possible.

After forming the wirings 701 to 707, a bank 712 is formed as shown in FIG. 17. The bank 712 may be formed by patterning an insulating film or organic resin film containing silicon with a thickness of 100 to 400 nm.

Incidentally, because the bank 712 is an insulating film, caution must be paid to element electrostatic breakdown during deposition. In this embodiment added is a carbon particle or metal particle to an insulating film as a material for the bank 712, thereby reducing resistivity and suppressing occurrence of static electricity. In such a case, the addition amount of carbon or metal particle may be adjusted to provide a resistivity of $1\times10^6$ to $1\times10^{12}$ Ωm (preferably $1\times10^8$ to $1\times10^{10}$ Ωm).

A light emitting layer 713 is formed on the pixel electrode 711. Incidentally, although FIG. 17 shows only one pixel, this embodiment separately forms light emitting layers correspondingly to the respective colors of R (red), G (green) and B (blue). Meanwhile, in this embodiment is formed a low molecular weight organic light-emitting material by the deposition method. Specifically, this is a lamination structure having a copper phthalocyanine (CuPc) film provided with a thickness of 20 nm as a hole injecting layer and a tris-8-qyuinolinolato aluminum complex ($Alq_3$) film provided thereon with a thickness of 70 nm as a light emitting layer. The color of emission light can be controlled by adding a fluorescent pigment, such as quinacridone, perylene or DCM1, to $Alq_3$.

However, the foregoing example is an example of organic light-emitting material to be used for a light emitting layer and not necessarily limited to this. It is satisfactory to form a light emitting layer (layer for light emission and carrier movement therefore) by freely combining a light emitting layer, a charge transporting layer and a charge injection layer. For example, although in this embodiment was shown the example in which a low molecular weight organic light-emitting material is used for a light emitting layer, it is possible to use an intermediate molecular weight organic light-emitting material or polymeric organic light-emitting material. An intermediate molecular weight organic light-emitting material can be defined in this specification that an aggregate of an organic compound which does not have subliming property or dissolving property (preferably, an aggregate which has number of molecular of 20 or less), or an organic compound which has a molecular chain length of 10 μm of less. As an example of using high molecular light-emitting material, the laminated pad can be made polythiophene (PEDOT) films with a thickness of 20 nm is provided by spin coating method as a hole injection layer, and paraphenylene-vinylene (PPV) films with a thickness of 100 nm is provided thereon as a light emitting layer. The light emitting wave length can be selected from red through blue by using π-conjugated system polymer of PPV. The inorganic material such as a silicon carbide can be used as a charge transporting layer and a charge injection layer. These organic light-emitting material and inorganic light-emitting material are formed by using known materials.

Next, a cathode 714 of a conductive film is provided on the light emitting layer 713. In this embodiment, as the conductive film is used an alloy film of aluminum and lithium. A known MgAg film (alloy film of magnesium and silver) may be used. As the cathode material may be used a conductive film of an element belonging to the periodic-table group 1 or 2, or a conductive film added with such an element.

A light-emitting element 715 is completed at a time having formed up to the cathode 714. Incidentally, the light-emitting element 715 herein refers to a diode formed with a pixel electrode (anode) 711, a light emitting layer 713 and a cathode 714.

It is effective to provide a passivation film 716 in such a manner to completely cover the light-emitting element 715. The passivation film 716 is formed by an insulating film including a carbon film, a silicon nitride film or a silicon oxynitride film, and used is an insulating film in a single layer or a combined lamination.

In such a case, it is preferred to use a film favorable in coverage as a passivation film. It is effective to use a carbon film, particularly DLC (diamond-like carbon) film. The DLC film, capable of being deposited in a temperature range of from room temperature to 100° C. or less, can be easily deposited over the light emitting layer 713 low in heat resistance. Meanwhile, the DLC film, having a high blocking effect to oxygen, can suppress the light emitting layer 713 from oxidizing. Consequently, prevented is the problem of oxidation in the light emitting layer 713 during the following seal process.

Furthermore, a seal member 717 is provided on the passivation film 716 to bond a cover member 718. For the seal member 717 used may be an ultraviolet curable resin. It is effective to provide therein a substance having a hygroscopic effect or an antioxidant effect. Meanwhile, in this embodiment, for the cover member 718 used is a glass substrate, quartz substrate or plastic substrate (including a plastic film) having carbon films (preferably diamond-like carbon films) formed on the both surfaces thereof.

Thus, completed is a light-emitting device having a structure as shown in FIG. 17. Incidentally, it is effective to continuously carry out, without release to the air, the process to form a passivation film 716 after forming a bank 712 by using a deposition apparatus of a multi-chamber scheme (or in-line scheme). In addition, with further development it is possible to continuously carry out the process up to bonding a cover member 718, without release to the air.

In this manner, n-channel TFTs 731, 732, a switching TFT (n-channel TFT) 733 and a current control TFT (n-channel TFT) 734 are formed on the substrate 700.

Furthermore, as was explained using FIG. 17, by providing an impurity region overlapped with the gate electrode through an insulating film, it is possible to form an n-channel TFT resistive to the deterioration resulting from hot-carrier effect. Consequently, a reliable light emitting device can be realized.

Meanwhile, this embodiment shows only the configuration of the pixel portion and driver circuit. However, according to the manufacturing process in this embodiment, besides there, it is possible to form logic circuits such as a signal division circuit, a D/A converter, an operation amplifier, a γ-correction circuit on a same insulator. Furthermore, a memory or microprocessor can be formed.

The light emitting device manufactured as above comprises TFT manufactured by a semiconductor film, wherein a laser light having a periodic or uniform energy distribution is irradiated and a crystal grain with a large grain size is formed. Thus, the light emitting device ensures a good operational characteristic and high reliability. The light emitting device can be used as a display portion for an electronic appliance in various kinds.

Incidentally, this embodiment can be implemented by combining any one of Embodiments 1 to 9.

Embodiment 12

Figure 18:
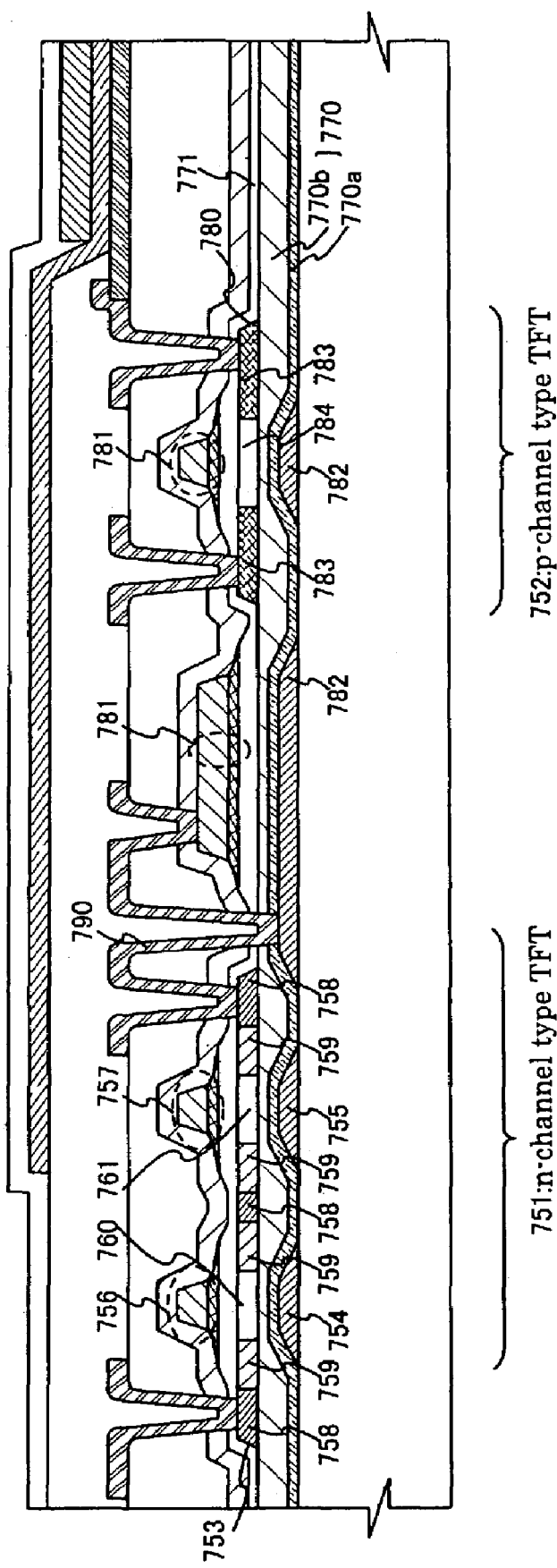
FIG. 18 is a diagram showing a method of manufacturing a semiconductor device using laser apparatus of the present invention.

In this embodiment, an explanation is made for a structure of a pixel of a light emitting device as one of the semiconductor devices of the present invention, which is different from the structure of Embodiment 1. FIG. 18 is a sectional view of the pixel of the light emitting device of this embodiment.

Reference numeral 751 denotes an n-channel TFT and 752 denotes a p-channel TFT. The n-channel TFT 751 has a semiconductor film 753, a first insulating film 770, first electrodes 754 and 755, a second insulating film 771 and second electrodes 756 and 757. Then, the semiconductor film 753 has a one conductivity type impurity region at first concentration 758, a one conductivity type impurity region at second concentration 759, and channel forming regions 760 and 761.

The first electrodes 754 and 755 and the channel forming regions 760 and 761 overlap with the first insulating film 770 interposed therebetween, respectively. Further, the second electrodes 756 and 757 and the channel forming regions 760 and 761 overlap with the second insulating film 771 interposed therebetween, respectively.

The p-channel TFT 752 has a semiconductor film 780, first insulating films 770, a first electrode 781, a second insulating film 771 and a second electrode 781. Then, the semiconductor film 780 has one conductivity type impurity regions at third concentration 783, and a channel forming region 784.

The first electrode 781 and the channel forming region 784 overlap with the first insulating film 770 interposed therebetween. Further, the second electrode 782 and the channel forming region 784 overlap with the second insulating film 771 interposed therebetween.

The first electrode 781 and the second electrode 782 are electrically connected through a wiring 790.

The laser apparatus of the present invention can be used in the process of crystallizing and activating the semiconductor films 753 and 780 or in the process of using laser annealing and others.

In this embodiment, a TFT used as a switching element (the n-channel TFT 751 in this embodiment) applies a constant voltage to the first electrode. By applying a constant voltage to the first electrode, it is possible to suppress variation of threshold in comparison with the case where the electrode is one, and to suppress the OFF-current.

Further, a TFT which causes a larger amount of current than the TFT used as the switching element to flow (the p-channel TFT 752 in this embodiment) electrically connects the first electrode and the second electrode. By applying the same voltage to the first electrode and the second electrode, a depletion layer is expanded fast substantially as in the case of making the thickness of the semiconductor film thin. Therefore, it is possible to reduce a sub-threshold coefficient and further to improve the field-effect mobility. Accordingly, it is possible to increase ON-current in comparison with the case where the electrode is one. As a result, it is possible to reduce driving voltage by using the TFT having this structure as the driving circuit. Furthermore, since the ON-current can be increased, it is possible to reduce the size of the TFT (particularly, the channel width). Therefore, it is possible to enhance integration density.

Note that it is possible to implement this embodiment combined with any one of Embodiments 1 to 11.

Embodiment 13

Figure 19:
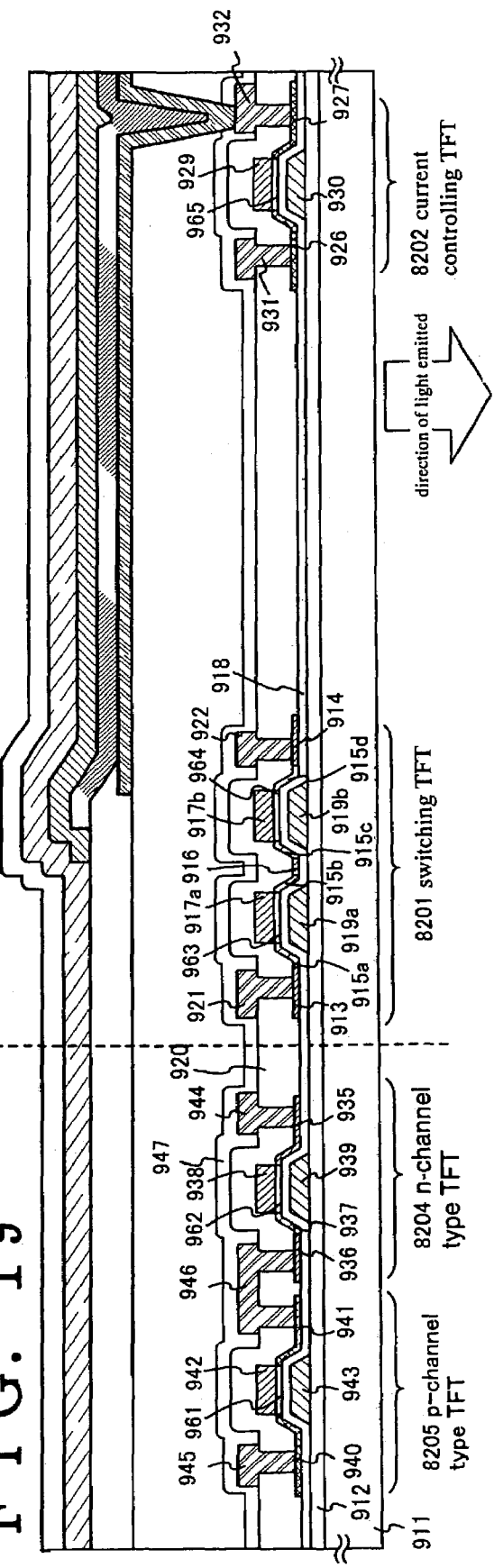
FIG. 19 is a diagram showing a method of manufacturing a semiconductor device using laser apparatus of the present invention.
Figure 20:
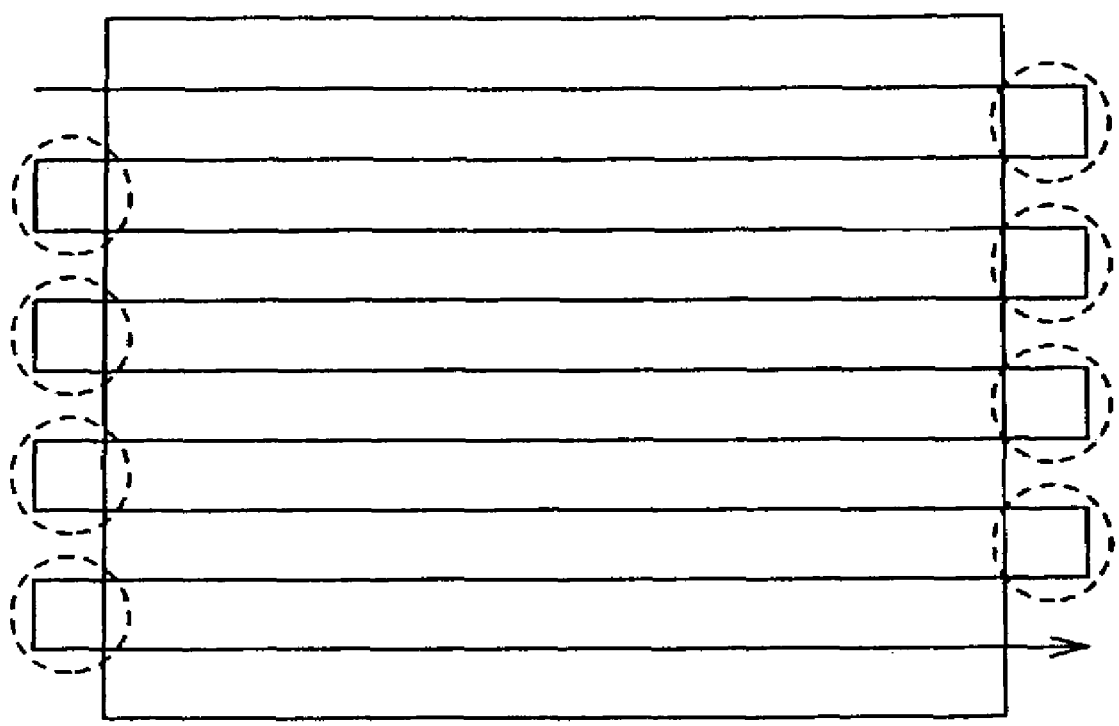
FIG. 20 is a diagram showing the direction in which the laser light irradiation position is moved in a process object in prior art.

This embodiment will be described a configuration differing from the configurations in Embodiments 1 and 12 of pixels of a light emitting device which is one of semiconductor devices of the present invention. FIG. 19 is a sectional view of the pixels of the light emitting device in this embodiment.

Reference numeral 911 denotes a substrate and reference numeral 912 denotes an insulating film which becomes a base (hereafter referred to as a base film) in FIG. 19. A light transmitting substrate, typically a glass substrate, a quartz substrate, a glass ceramic substrate, or a crystalline glass substrate can be used as the substrate 911. However, the substrate used must be one able to withstand the highest process temperature during the manufacturing processes.

Reference numeral 8201 denotes a switching TFT, reference numeral 8202 denotes a current controlling TFT, and the switching TFT is formed by n-channel TFT and the current controlling TFT is formed by p-channel TFT. When the direction of light emitted from the light emitting layer is toward the substrate lower side (surface where TFTs and the organic light emitting layer are not formed), the above structure is preferable. However, the present invention is not limited to this structure. The switching TFT and the current controlling TFT may be either n-channel TFTs or p-channel TFTs.

The switching TFT 8201 has an active layer containing a source region 913, a drain region 914, LDD regions 915a to 915d, a separation region 916, and an active layer including channel forming regions 919a and 919b, a gate insulating film 918, gate electrodes 919a and 919b, a first interlayer insulating film 920, a source signal line 921 and a drain wiring 922. Note that the gate insulating film 918 and the first interlayer insulating film 920 may be common among all TFTs on the substrate, or may differ depending upon the circuit or the element.

Furthermore, the switching TFT 8201 shown in FIG. 19 is electrically connected to the gate electrodes 919a and 919b, becoming namely a double gate structure. Not only the double gate structure, but also a multi gate structure (a structure containing an active layer having two or more channel forming regions connected in series) such as a triple gate structure, may of course also be used.

The multi gate structure is extremely effective in reducing the off current, and provided that the off current of the switching TFT is sufficiently lowered, a storage capacitor connected to the gate electrode of the current controlling TFT 8202 can be have its capacitance reduced to the minimum necessary. Namely, the surface area of the storage capacitor can be made smaller, and therefore using the multi gate structure is also effective in expanding the effective light emitting surface area of the light emitting elements.

In addition, the LDD regions 915a to 915d are formed so as not to overlap the gate electrodes 919a and 919b through the gate insulating film 918 in the switching TFT 8201. This type of structure is extremely effective in reducing the off current. Furthermore, the length (width) of the LDD regions 915a to 915d may be set from 0.5 to 3.5 μm, typically between 2.0 and 2.5 μm. Further, when using a multi gate structure having two or more gate electrodes, the separation region 916 (a region to which the same impurity element, at the same concentration, as that added to the source region or the drain region, is added) is effective in reducing the off current.

Next, the current controlling TFT 8202 is formed having an active layer containing a source region 926, a drain region 927, and a channel forming region 929; the gate insulating film 918; a gate electrode 930, the first interlayer insulating film 920; a source wiring 931; and a drain wiring 932. The current controlling TFT 8202 is a p-channel TFT in this embodiment.

Further, the drain region 914 of the switching TFT 8201 is connected to the gate electrode 930 of the current controlling TFT 8202. Although not shown in the figure, specifically the gate electrode 930 of the current controlling TFT 8202 is electrically connected to the drain region 914 of the switching TFT 8201 through the drain wiring (also referred to as a connection wiring) 922. The gate electrode 930 is a single gate structure in this embodiment, however, the multi gate structure can be also applied. The source wiring 931 of the current controlling TFT 8202 is connected to an power source supply line (not shown in the figure).

The structures of the TFTs formed within the pixel are explained above, but a driver circuit is also formed simultaneously at this point. A CMOS circuit, which becomes a basic unit for forming the driver circuit, is shown in FIG. 19.

A TFT having a structure in which hot carrier injection is reduced without an excessive drop in the operating speed is used as an n-channel TFT 8204 of the CMOS circuit in FIG. 19. Note that the term driver circuit indicates a source signal line driver circuit and a gate signal line driver circuit here. It is also possible to form other logic circuit (such as a level shifter, an A/D converter, and a signal division circuit).

An active layer of the n-channel TFT 8204 of the CMOS circuit contains a source region 935, a drain region 936, an LDD region 937, and a channel forming region 938. The LDD region 937 overlaps with a gate electrode 939 through the gate insulating film 918.

Formation of the LDD region 937 on only the drain region 936 side is so as not to have drop the operating speed. Further, it is not necessary to be very concerned about the off current with the n-channel TFT 8204, and it is good to place more importance on the operating speed. Thus, it is desirable that the LDD region 937 is made to completely overlap the gate electrode to decrease a resistance component to a minimum. It is therefore preferable to eliminate so-called offset.

Furthermore, there is almost no need to be concerned with degradation of a p-channel TFT 8205 of the CMOS circuit, due to hot carrier injection, and therefore no LDD region need to be formed in particular. Its active layer therefore contains a source region 940, a drain region 941, and a channel forming region 942, and a gate insulating film 918 and a gate electrode 943 are formed on the active layer. It is also possible, of course, to take measures against hot carrier injection by forming an LDD region similar to that of the n-channel TFT 8204.

The references numeral 961 to 965 are masks to form the channel forming regions 942, 938, 917a, 917b and 929.

Further, the n-channel TFT 8204 and the p-channel TFT 8205 have source wirings 944 and 945, respectively, on their source regions, through the first interlayer insulating film 920. In addition, the drain regions of the n-channel TFT 8204 and the p-channel TFT 8205 are mutually connected electrically by a drain wiring 946.

The laser device of the present invention can be in the crystallization step of the active layer, activation step, and a step using a laser annealing.

Incidentally, the configuration of the present invention can be implemented by freely combining Embodiments 1 to 11.

Embodiment 14

In this embodiment, an explanation is made for a case of removing an impurity mixed in the semiconductor film melted when the semiconductor film is crystallized by laser light irradiation. Hereinafter, there is briefly described a typical manufacturing process with reference to FIGS. 21A and 21G.

Figure 21A:
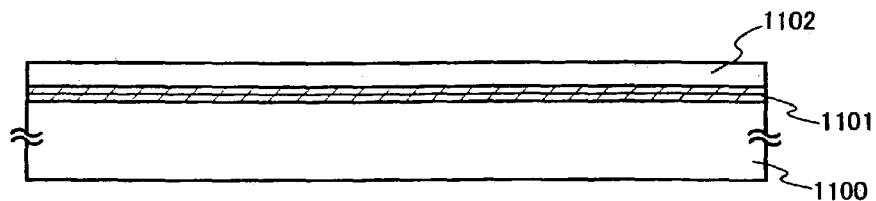
FIGS. 21A to 21G are diagrams showing a method of manufacturing a semiconductor device using laser apparatus of the present invention.

In FIG. 21A, reference numeral 1100 denotes a substrate having an insulating surface, 1101 denotes a base insulating film and 1102 denotes a semiconductor film having an amorphous structure.

First, on the substrate 1100, the base insulating film 1101 comprised of an insulating film such as a silicon oxide film, a silicon nitride film, or silicon oxynitride film is formed as a blocking layer. Here, as the base insulating film 1101, a two layer structure (silicon oxynitride film having a thickness of 50 nm, and silicon oxynitride film having a thickness of 100 nm) is taken, but a single layer film or a structure in which two or more layers are layered may be used. Incidentally, in the case where there is no need to provide a blocking layer, the base insulating film may not be formed (FIG. 21A).

Figure 21B:
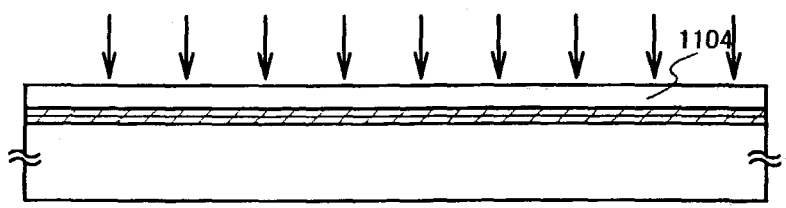

Next, the semiconductor film 1102 having an amorphous structure is crystallized on the base insulating film by well-known means to form a semiconductor film 1104 having a crystalline structure (FIG. 21B).

In this embodiment, as the semiconductor film having the crystalline structure, the semiconductor film 1102 having an amorphous structure obtained by plasma CVD, reduced pressure thermal CVD, or sputtering is crystallized by laser annealing using the laser apparatus of the present invention.

As the laser oscillation apparatus, a gas laser or a solid laser of continuous oscillation or pulse oscillation can be used. As a gas laser, there is an excimer laser, an Ar laser, a Kr laser, or the like. As a solid laser, there is a YAG laser, a $YVO_4$ laser, a YLF laser, a $YAlO_3$ laser, a glass laser, a ruby laser, an alexandrite laser, a Ti: sapphire laser, a $Y_2O_3$ laser, or the like. As a solid laser, it is possible to use a laser using crystal such as YAG, $YVO_4$, YLF, or $YAlO_3$ doped with Cr, Nd, Er, Ho, Ce, Co, Ti, Yb or Tm, or the like. A fundamental wave of the laser concerned depends on a doped material and a laser light having the fundamental wave of around 1 μm is obtained. A harmonic wave with respect to the fundamental wave can be obtained by using a nonlinear optical element. As to the detailed condition of laser light irradiation, the description of Embodiment 9 can be referred to.

Note that it is desirable to form the semiconductor film such that oxygen concentration (SIMS analysis) in the semiconductor film 1104 having the crystalline structure is equal to $5\times10^{18}/cm^3$ or lower.

Next, there is formed a barrier layer 1105 mainly containing silicon on the semiconductor film 1104 having the crystalline structure. Note that the barrier layer 1105 may be extremely thin. It may be a natural oxide film or an oxide film which is obtained through oxidization by generating ozone according to ultraviolet ray irradiation under the atmosphere containing oxygen. In addition, as this barrier layer 1105, there may be used an oxide film which is obtained through oxidization by using a solution containing ozone used for surface treatment called hydro-washing which is performed for removing carbon, that is, an organic material. This barrier layer 1105 is mainly used as an etching stopper. Further, after the barrier layer 1105 is formed, channel doping may be performed to conduct activation by irradiating a strong light.

Figure 21C:
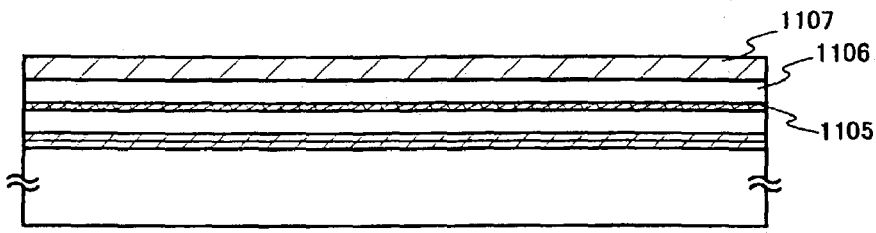

Next, there is formed a second semiconductor film 1106 on the barrier layer 1105 (FIG. 21C). The second semiconductor film 1106 may be a semiconductor film having an amorphous structure or a semiconductor film having a crystalline structure. The thickness of the second semiconductor film 1106 is assumed to be 5 to 50 nm, preferably, 10 to 20 nm. It is desirable that the second semiconductor film 1106 contains oxygen (the concentration according to SIMS analysis is equal to $5\times10^{18}/cm^3$ or more, preferably, equal to $1\times10^{19}/cm^3$ or more) to thereby improve gettering efficiency.

Figure 21D:
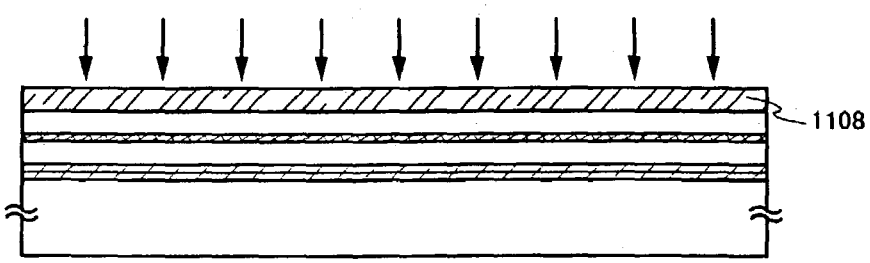

Next, there is formed a third semiconductor film (gettering site) 1107 containing a rare gas element on the second semiconductor film 1106. This third semiconductor layer 1107 may be a semiconductor film having an amorphous structure formed by using plasma CVD, reduced pressure thermal CVD, or sputtering or a semiconductor film having a crystalline structure. The third semiconductor film may be a semiconductor film containing a rare gas element in the process of film formation. Further, the rare gas element may be added after film formation of the semiconductor film which dose not contain the rare gas element. In this embodiment, there is shown a case where after the third semiconductor film 1107 containing the rare gas element in the process of film formation is formed, the rare gas element is further added selectively to form a third semiconductor film 1108 (FIG. 21D). Furthermore, film formation may be consecutively performed without exposing the second semiconductor film and the third semiconductor film to the atmosphere. In addition, a sum of the thickness of the second semiconductor film and the thickness of the third semiconductor film may be 30 to 200 nm, for example, 50 nm.

In this embodiment, the second semiconductor film 1106 makes an interval between the first semiconductor film 1104 and the third semiconductor film (gettering site) 1108. In gettering, an impurity element such as metal existing within the semiconductor film 1104 tends to gather around a boundary of the gettering site, and thus as shown in this embodiment, it is desirable that the boundary of the gettering site is moved away from the first semiconductor film 1104 by the second semiconductor film 1106 to thereby improve the gettering efficiency. Moreover, the second semiconductor film 1106 has the effect of blocking in order to prevent a state where the impurity element contained in the gettering site is diffused to reach an interface of the first semiconductor film at the time of gettering. Further, the second semiconductor film 1106 has the effect of protecting so as not to cause a damage to the first semiconductor film in the case of adding the rare gas element.

Figure 21E:
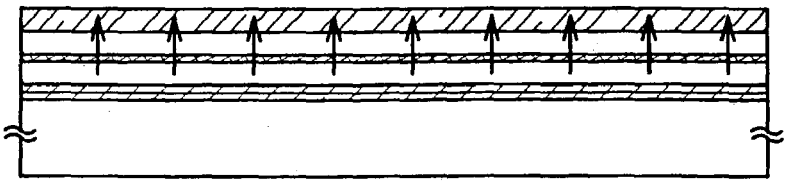

Next, gettering is performed. In the gettering process, heat treatment may be conducted at 450 to 800° C. for 1 to 24 hours, for example, at 550° C. for 14 hours in a nitrogen atmosphere. Further, instead of heat treatment, a strong light may be irradiated. Furthermore, in addition to heat treatment, a strong light may be irradiated. Also, a heated gas may be jetted to heat the substrate. In this case, heat treatment may be performed at 600 to 800° C., more desirably, 650 to 750° C. for 1 to 60 minutes and the processing time can be reduced. Through this gettering, the impurity element is moved in the direction of an arrow in FIG. 21E to remove the impurity element contained in the semiconductor film 1104 covered with the barrier layer 1105 and to reduce the concentration of the impurity element. Here, all the impurity elements are moved to the third semiconductor film 1108 so as not to segregate to the first semiconductor film 1104, and there hardly exist the impurity elements contained in the first semiconductor film 1104. That is, gettering is sufficiently performed such that the impurity element concentration in the film is equal to $1\times10^{18}/cm^3$ or lower, desirably, equal to $1\times10^{17}/cm^3$ or lower.

Figure 21F:
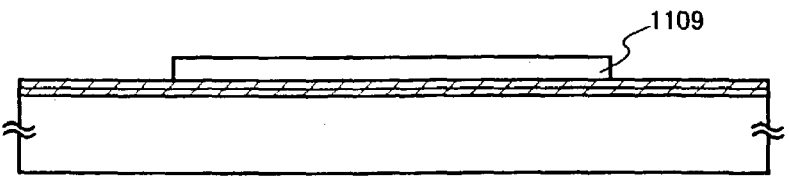

Next, after selectively removing only the semiconductor films shown by reference numerals 1106 and 1108, using the barrier layer 1105 as an etching stopper, there is formed a semiconductor layer 1109 having a desired shape by patterning the semiconductor film 1104 using a well-known patterning technique (FIG. 21F).

Then, after washing the surface of the semiconductor layer using an etchant containing hydrofluoric acid, there is formed an insulating film mainly containing silicon as a gate insulating film 1110. It is desirable to perform this surface washing and formation of the gate insulating film consecutively without being exposed to the atmosphere.

Next, after washing the gate insulating film surface, there is formed a gate electrode 1111. An impurity element for imparting n-type to the semiconductor (P, As, and the like), that is, phosphorus in this case, is appropriately added to form a source region 1112 and a drain region 1113. After adding, heat treatment, irradiation with a strong light, or irradiation with the laser light using the laser apparatus of the present invention is performed in order to activate the impurity element. Further, it is possible to attain recovery from plasma damage to the gate insulating film or plasma damage to the interface between the gate insulating film and the semiconductor layer, simultaneously with the activation. In particular, in the atmosphere at a room temperature to 300° C., it is very effective to activate the impurity element by irradiating the second harmonic wave of the YAG laser from the top surface or the back surface. The YAG laser is preferable activating means because cost of maintenance is low.

Figure 21G:
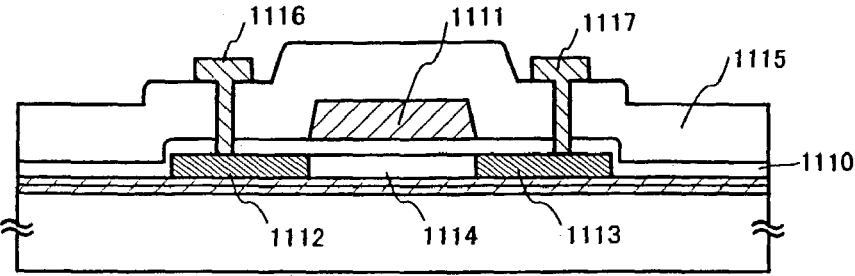

As the subsequent processes, there is formed an interlayer insulating film 1115 to conduct hydrogenation. Then, there is formed a contact hole reaching a source or drain region to form a source electrode 1116 and a drain electrode 1117. Thus, the TFT is completed (FIG. 21G).

In the TFT thus obtained, the impurity element contained at least in the channel forming region 1114 is removed and the rare gas element is not contained.

Further, this embodiment is not limited to the structure of FIGS. 21A to 21G. If necessary, there may be adopted a lightly doped drain (LDD) structure having an LDD region between the channel forming region and the drain region (or the source region). In this structure, between the channel forming region and the source or drain region formed by adding an impurity element at a high concentration, there is provided a region added with an impurity element at a low concentration. This region is called an LDD region. In addition, a so-called GOLD (gate-drain overlapped LDD) structure may be taken in which the LDD region is disposed overlapping the gate electrode through the gate insulating film.

Further, an explanation is made using an n-channel TFT, here, but it is needless to say that a p-channel TFT can be formed by using an impurity element for imparting p-type to the semiconductor instead of an impurity element for imparting n-type to the semiconductor.

Furthermore, in this embodiment, the semiconductor film is patterned after gettering is completed, but this embodiment is not limited to this structure. Patterning of the semiconductor film may be performed before crystallization or may be performed before forming the barrier layer further after crystallization. Also, before crystallizing the semiconductor film, or before forming the barrier layer after crystallization, patterning may be roughly performed, and then after gettering, patterning may be performed again to form the active layer of the TFT.

Furthermore, an explanation is made here using a top gate TFT as an example, but it is possible to apply this embodiment irrespective of the TFT structure. For example, it is possible to apply this embodiment to a bottom gate (inverse stagger) TFT or a forward stagger TFT.

Note that it is possible to implement the structure of this embodiment freely combined with Embodiments 1 to 13.

Embodiment 15

This embodiment describes an example of using a CPU to control operations of second means, third means, and fourth means which the laser apparatus of the present invention has. The second means is for rotating a process object. The third means is for moving the center of the rotation along a straight line. The fourth means is for irradiating a certain region within the moving range of the process object with laser light from a fixed direction at a fixed position.

Figure 22:
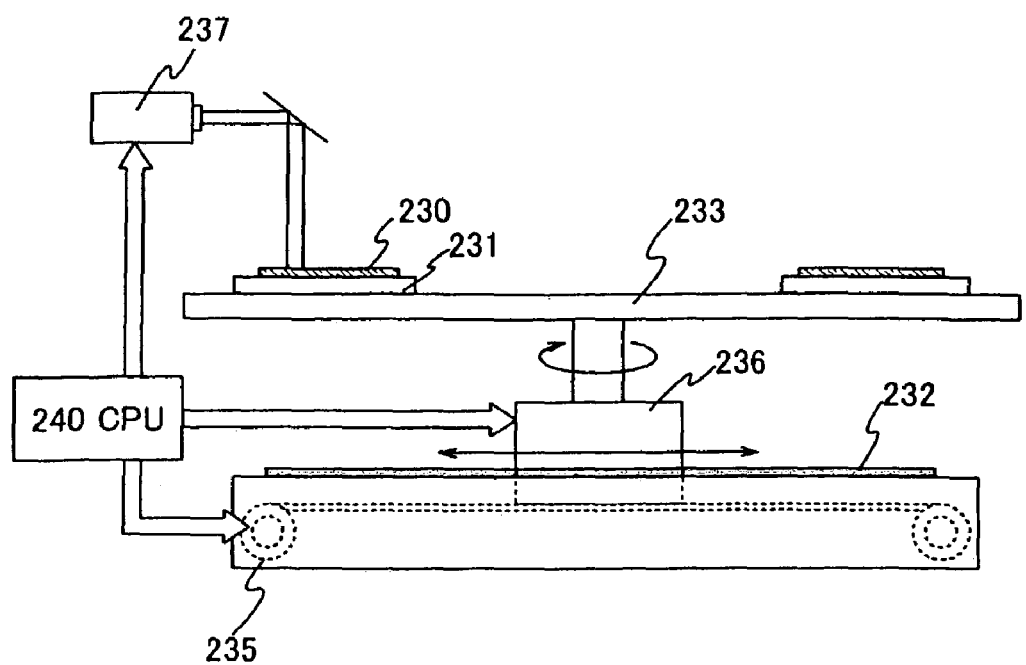
FIG. 22 is a block diagram of laser apparatus according to the present invention.

The laser apparatus of the present invention in FIG. 22 has a stage 231 that corresponds to first means for placing a process object 230. The apparatus also has a rotating base 233 and rotating base motor 236 that correspond to the second means for rotating the stage 231. A guide rail 232 and a moving motor 235 correspond to the third means for moving the rotation center along a straight line. A laser oscillator and other optical system 237 corresponds to the fourth means for irradiating a specific region within the moving range of the process object 230 with laser light from a fixed direction at a fixed position.

The certain region to be irradiated with laser light is on a line extended from the linear track along which the center of rotation of the rotating base 233 is moved.

In order to keep the moving speed of the irradiation position constant and to make the laser light irradiation time the same for every portion of the process object, the rotation speed has to be adjusted as the center of the rotation is moved. A CPU 240 controls the rotation speed of the process object 230 and the moving speed of the rotation center by taking into account a proper laser light irradiation time for each portion of the process objects 230. Specifically, the rotation speed is lowered as the certain region to be irradiated with laser light becomes further from the center of the rotation whereas the rotation speed is raised as the region approaches the center of the rotation.

If the moving speed of the rotation center, denoted by reference numeral 234, is too fast with respect to the rotation speed of the process object 230, it is impossible to irradiate the entire surface of the process object. Therefore the rotation speed of the process object 230 and the moving speed of the rotation center 234 are adjusted appropriately by the CPU in order to irradiate the entire surface of the process object 230.

Each portion of the process object 230 can be irradiated with laser light several times by adjusting the rotation speed of the process object 230 and the moving speed of the rotation center. Alternatively, the process object 230 can receive several times of laser irradiation by moving the center of the rotation in one direction and then in the opposite direction.

If the laser light irradiation position on the rotating base in the second time laser irradiation is changed from the position in the first time laser irradiation as shown in Embodiment 2, the CPU 240 may control the fourth means to control the irradiation position.

The laser apparatus of the present invention may have means to adjust the temperature of a process object in addition to the four means described above. The means for adjusting the temperature of a process object may be controlled by the CPU 240.

This embodiment may be combined with Embodiments 1 to 14.

Embodiment 16

Given as examples of electric equipment employing a semiconductor device formed by the laser apparatus of the present invention is applied are: a video camera; a digital camera; a goggle type display (head mounted display); a navigation system; an audio reproducing device (car audio, an audio component, and the like); a laptop computer; a game machine; a portable information terminal (a mobile computer, a cellular phone, a portable game machine, an electronic book, etc.); and an image reproducing device including a recording medium (specifically, a device equipped with a display device which can reproduce a recording medium such as a digital versatile disk (DVD), and can display the image). Specific embodiments of the electric equipment are shown in FIGS. 24A to 24H.

FIG. 24A shows a display device, which comprises a casing 2001, a supporting base 2002, a display portion 2003, speaker portions 2004, a video input terminal 2005, etc. The semiconductor device formed by the present invention is applied to the display portion 2003. The semiconductor device is self-luminous and does not need a backlight, so that it can make a thinner display portion than liquid display devices can. The term display device includes every display device for displaying information such as one for a personal computer, one for receiving TV broadcasting, and one for advertisement.

FIG. 24B shows a digital still camera, which comprises a main body 2101, a display portion 2102, an image receiving portion 2103, operation keys 2104, an external connection port 2105, a shutter 2106, etc. The semiconductor device formed by the present invention is applied to the display portion 2102 and other circuits.

FIG. 24C shows a laptop computer, which comprises a main body 2201, a casing 2202, a display portion 2203, a keyboard 2204, an external connection port 2205, a pointing mouse 2206, etc. The semiconductor device formed by the present invention is applied to the display portion 2203 and other circuits.

FIG. 24D shows a mobile computer, which comprises a main body 2301, a display portion 2302, a switch 2303, operation keys 2304, an infrared ray port 2305, etc. The semiconductor device formed by the present invention is applied to the display portion 2302.

FIG. 24E shows a portable image reproducing device equipped with a recording medium (a DVD player, to be specific). The device comprises a main body 2401, a casing 2402, a display portion A 2403, a display portion B 2404, a recording medium (DVD or the like) reading portion 2405, operation keys 2406, speaker portions 2407, etc. The display portion A 2403 mainly displays image information whereas the display portion B 2404 mainly displays text information. The semiconductor device formed by the present invention is applied to the display portions A 2403, the display portion B 2404, and the other circuits. Note that, the term image reproducing device equipped with a recording medium includes domestic game machines.

FIG. 24F shows a goggle type display (head mounted display), which comprises a main body 2501, display portions 2502, and arm portions 2503. The semiconductor device formed by the present invention is applied to the display portions 2502 and the other circuits.

FIG. 24G shows a video camera, which comprises a main body 2601, a display portion 2602, a casing 2603, an external connection port 2604, a remote control receiving portion 2605, an image receiving portion 2606, a battery 2607, an audio input portion 2608, operation keys 2609, eye contact portion 2610 etc. The semiconductor device formed by the present invention is applied to the display portion 2602 and the other circuits.

FIG. 24H shows a cellular phone, which comprises a main body 2701, a casing 2702, a display portion 2703, an audio input portion 2704, an audio output portion 2705, operation keys 2706, an external connection port 2707, an antenna 2708, etc. The semiconductor device formed by the present invention is applied to the display portion 2703 and the other circuits. If the display portion 2703 displays white characters on a black background, power consumption of the cellular phone can be reduced.

Note that, in addition to the above mentioned electronic equipments, a front type or rear type projector can be used.

As described above, the application range of the present invention is applied is very wide and electric equipment in various field can employ the device. The electric equipments in this embodiment may use the semiconductor device formed in Embodiments 1 to 15.

Embodiment 17

In this embodiment, a case of crystallizing a semiconductor film using a laser apparatus of the present invention is described.

Figure 25A:
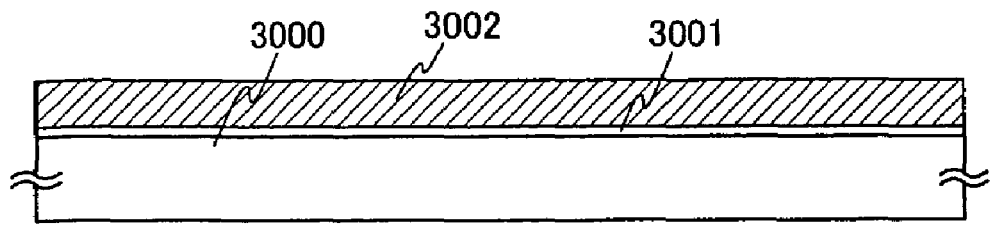
FIGS. 25A to 25D are diagrams showing a method of crystallizing a semiconductor film using laser apparatus of the present invention.

In FIG. 25A, reference numeral 3000 denotes a substrate which includes an insulating surface, reference numeral 3001 denotes a base film which is an insulating film preventing impurity elements in a substrate from penetrating into a semiconductor film, and reference numeral 3002 is a semiconductor film having an amorphous structure.

In FIG. 25A, a glass substrate, a quartz substrate, a ceramic substrate or the like can be used as the substrate 3000. Alternatively, a substrate such as a silicon substrate, a metal substrate or a stainless substrate having an insulating film formed on the surface thereof may be used. It is also possible to use a plastic substrate having heat resistance against the treatment temperature in the steps of this embodiment.

As shown in FIG. 25A, the base insulating film 3001 is formed out of a silicon oxide film, a silicon nitride film, a silicon oxide nitride film ($SiO_xN_y$) or the like. As a typical example, a film having a two-layer structure in which a first silicon oxide nitride film formed using $SiH_4$, $NH_3$ and $N_2O$ as reaction gas and having a thickness of 30 to 100 nm and a second silicon oxide nitride film formed using $SiH_4$ and $N_2O$ as reaction gas and having a thickness of 30 to 150 nm are layered, is used as the base insulating film 3001. Alternatively, a film having a three-layer structure in which a first silicon oxide nitride film, a second silicon oxide nitride film and a silicon nitride film are sequentially layered may be used as the base insulating film 3001.

Next, a semiconductor film 3002 having an amorphous structure is formed on the base insulating film 3001. A semiconductor material mainly containing silicon is used to form the semiconductor film 3002. Typically, an amorphous silicon film or an amorphous silicon germanium film is used as the semiconductor film 3002. The semiconductor film 3002 is formed to have a thickness of 10 to 100 nm by the plasma CVD method, a low pressure CVD method or a sputtering method. It is preferable that the concentration of impurities such as oxygen and nitrogen contained in the film of the semiconductor film 3002 having an amorphous structure, is decreased to not higher than $5 \times 10^{18}/cm^3$ (atom concentration measured by secondary ion mass spectroscopy). These impurities prevent later crystallization and, even after the crystallization, increase the density of a trapping center or recombination center. For these reasons, it is preferable to use not only high impurity material gas but also use an extreme high vacuum CVD system which includes a mirror treatment (field polishing) reaction chamber or an oil-free evacuation system.

Subsequently, the semiconductor film 3002 having an amorphous structure is irradiated and crystallized by the first laser light using the laser equipment of the present invention in the atmosphere or the oxygen atmosphere. In this embodiment, the $YVO_4$ laser of a continuation oscillation is used as the first laser. In this embodiment, output energy of laser light is set to 27 W, the beam spot of laser is formed into ellipse form having 500 μm×50 μm in long axis x short axis, and the laser light moves in the direction of a short axis of an ellipse. In addition, the output energy of laser light and the form of beam spot can be suitably set by the designer.

In this embodiment, a continuous emission type $YVO_4$ laser is used, but this embodiment is not limited to the comprising. As a laser oscillation device, excimer laser of pulse oscillation type or continuous emission type or YAG laser, $YVO_4$ laser are used. While the conditions for crystallization are appropriately selected by operator, pulse oscillation frequency is set at 300 Hz and a laser energy density is set at 100 to 400 mJ/cm² (typically, at 200 to 300 mJ/cm²) in the case of using an excimer laser. Alternatively, in the case of using a YAG laser, it is preferable to use the second higher harmonic wave while the pulse oscillation frequency is set at 30 to 300 kHz with the laser energy density being set at 300 to 600 mJ/cm² (typically 350 to 500 mJ/cm²). It may be performed to irradiate linearly corrected laser light with a width of 100 to 1000 μm, e.g., 400 μm, over the entire surface of the substrate while the overlapping ratio of linear laser lights at this time is set at 50 to 90%.

Note that, a gas laser or solid-state laser of continuous oscillation type or pulse oscillation type can be used. The gas laser such as an excimer laser, Ar laser, Kr laser and the solid-state laser such as YAG laser, $YVO_4$ laser, YLF laser, $YAlO_3$ laser, glass laser, ruby laser, alexandrite laser, Ti: sapphire laser, $Y_2O_3$ laser can be used as the laser light. Also, crystals such as YAG laser, $YVO_4$ laser, YLF laser, $YAlO_3$ laser wherein Cr, Nd, Er, Ho, Ce, Co, Ti, Yb or Tm is doped can be used as the solid-state laser. A basic wave of the lasers is different depending on the materials of doping, therefore a laser light having a basic wave of approximately 1 μm is obtained. A harmonic corresponding to the basic wave can be obtained by the using non-linear optical elements.

When a crystallization of an amorphous semiconductor film is conducted, it is preferable that the second harmonic through the fourth harmonic of basic waves is applied by using the solid state laser which is capable of continuous oscillation in order to obtain a crystal in large grain size. Typically, it is preferable that the second harmonic (with a thickness of 532 nm) or the third harmonic (with a thickness of 355 nm) of an Nd:YVO$_4$ laser (basic wave of 1064 nm) is applied. Specifically, laser lights emitted from the continuous oscillation type YVO$_4$ laser with 10 W output is converted into a harmonic by using the non-linear optical elements. Also, a method of emitting a harmonic by applying crystal of YVO$_4$ and the non-linear optical elements into a resonator. Then, more preferably, the laser lights are formed so as to have a rectangular shape or an elliptical shape by an optical system, thereby irradiating a substance to be treated. At this time, the energy density of approximately 0.01 to 100 MW/cm$^2$ (preferably 0.1 to 10 MW/cm$^2$) is required. The semiconductor film is moved at approximately 10 to 2000 cm/s rate relatively corresponding to the laser lights so as to irradiate the semiconductor film.

Figure 25B:
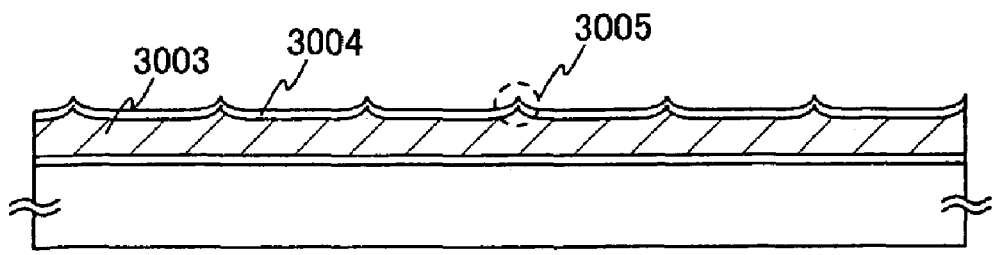

The semiconductor film 3002 having amorphous structure is crystallized by irradiation of laser light, and the semiconductor film 3003 which has crystallinity, and the oxidization film 3004 which contacts the semiconductor film 3003 are formed. In addition, the portion (ridge) 3005 which projected along with crystal grain boundary of the semiconductor film 3003 on the occasion of irradiation of laser light is formed. (FIG. 25B)

Subsequently, the oxidization film 3004 is removed. In this embodiment, the oxidization film 3004 is removed using the etchant of a hydrofluoric acid system, and the surface of the semiconductor film 3003 which has crystallinity is exposed. In addition, the method of removal of the oxidization film 3004 is not limited to the method mentioned above. For example, you may be so that the oxidization film 3004 may be removed using fluoride system gas.

Figure 25C:
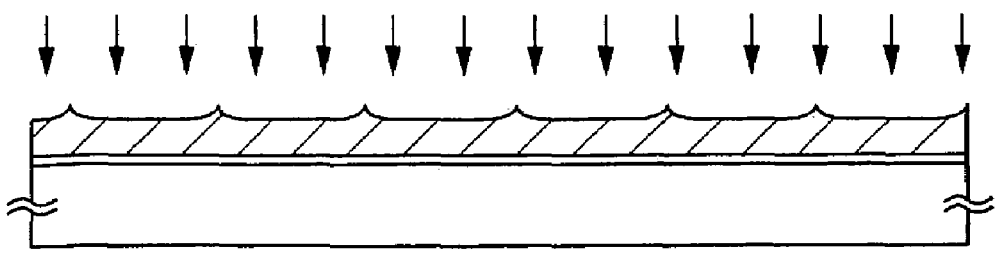
Figure 26A:
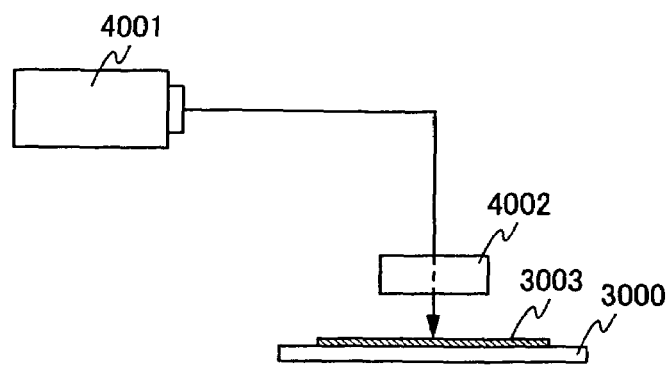
FIGS. 26A and 26B are diagrams showing an embodiment of laser apparatus of the present invention.
Figure 26B:
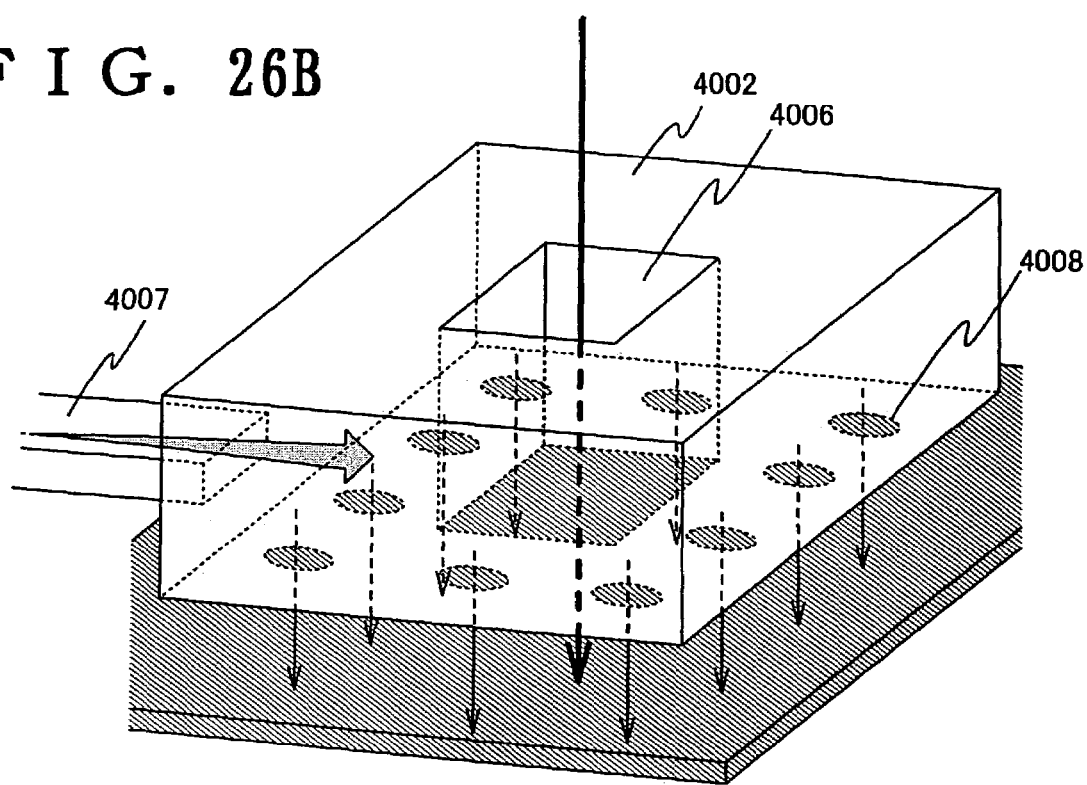

Subsequently, irradiate laser light (second laser light) under nitrogen or vacuum atmosphere to the semiconductor film 3003 which has crystallinity (FIG. 25C). In addition, when irradiating the second laser light under an inactive atmosphere, you may make it irradiate inactive gas only at the portion by which the laser light of the semiconductor film 3003 is irradiated, as shown in FIG. 26. For example, as shown in FIG. 26A, the laser light outputted from laser oscillation apparatus and the optical system 4001 can be irradiated to the semiconductor film 3003 through the slit of the gas spraying portion 4002. FIG. 26B is an enlargement of the gas spraying part 4002, and the slit 4006 to which the gas spraying part 4002 can pass laser light is formed. Moreover, the opening portion 4008 to which the inactive gas supplied through a conduit 4007 can inject the gas spraying part 4002 around the laser light of the semiconductor film 3003 being irradiated is formed. The inactive gas injected from the opening portion 4008 is sprayed on the semiconductor film 3003.

Figure 25D:
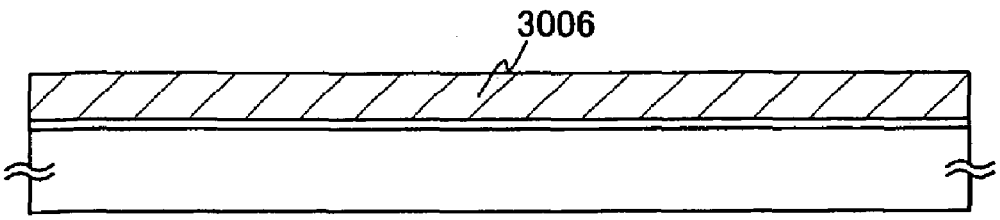

If the laser light (second laser light) is irradiated by the irradiation of the second laser light, the difference in level (P-V value: Peak to Valley value; difference in height between maximum and minimum) among the irregularities formed by the irradiation of the first laser light is decreased, i.e., the surface is flattened (FIG. 25D). The P-V value of the irregularities may be observed with an AFM (atomic force microscope). Specifically, the P-V value of the irregularities formed by the irradiation of the first laser light of about 10 nm to 30 nm can be decreased to not lower than 5 nm by the irradiation of the second laser light.

As this laser light (second laser light), an excimer laser light having a wavelength of not more than 400 nm or the second and third higher harmonic waves of the YAG laser can be employed. Alternatively, a laser light same as above-mentioned first laser light can be used.

Although the energy density of the second laser light is higher than that of the first laser light, the crystallinity of the semiconductor layer hardly changes before and after the irradiation. In addition, crystal states such as grain diameters hardly change. In other words, it is considered that the irradiation of the second laser light is intended only to flatten the surface of the semiconductor layer.

The flattening of the semiconductor layer 3006 having a crystal structure by the irradiation of the second laser light possesses high merit. For example, by improving the flatness of the semiconductor layer, it is possible to make the second insulating film to be formed in a later step as a gate insulating film thinner and to thereby improve the mobility of the TFT. In addition, by improving the flatness, it is possible to decrease OFF current in the manufacturing of the TFT.

This example can be carried out in free combination with Embodiments 1 to 16.

The laser apparatus of the present invention can move the laser light irradiation position on a process object in directions X and Y without changing the moving direction of the process object and can irradiate the entire surface of the process object with laser light even though the laser light is radiated from a fixed direction at a fixed position. Therefore the invention can avoid time loss that accompanies a change in moving direction of process object and can have enhanced processing efficiency compared to prior art.

The irradiation angle of laser light is fixed with respect to a process object irrespective of irradiation position. This prevents a returning beam that has been reflected in the process object, or interference, from varying in intensity between different irradiation positions, and makes it possible to perform generally uniform processing on the process object. When a semiconductor film is crystallized by laser irradiation, for example, the invention can prevent variation in crystallinity between semiconductor films in different positions. Furthermore, the present invention can make an optical system simpler than in the case where the irradiation direction of beam is changed to irradiate the entire process object with laser light.

What is claimed is:

1. A method of manufacturing a semiconductor device comprising:

irradiating a semiconductor film formed on an insulating surface with a laser light while rotating the semiconductor film and moving a center of the rotation along a straight line in order to enhance the crystallinity of the semiconductor film, wherein the semiconductor films formed on the insulating surface are irradiated with laser light at several times by moving the center of the rotation in one direction and then in the opposite direction.

2. A method of manufacturing a semiconductor device as claimed in claim 1, wherein the laser light is outputted from a laser oscillator and is processed by using an optical system.

3. A method of manufacturing a semiconductor device as claimed in claim 1, wherein the laser light irradiation position where the certain region and the process object which includes the semiconductor film overlap after the process objects finish one rotation partially overlaps the laser light irradiation position of when the rotation is started.

4. A method of manufacturing a semiconductor device as claimed in claim 1,
wherein the laser oscillator is a continuous wave solid-state laser.

5. A method of manufacturing a semiconductor device as claimed in claim 1,
wherein the laser oscillator is one or plural kinds selected from the group consisting of a continuous wave YAG laser, $YVO_4$ laser, YLF laser, $YAlO_3$ laser, glass laser, ruby laser, alexandrite laser, Ti: sapphire laser, and $Y_2O_3$ laser.

6. A method of manufacturing a semiconductor device as claimed in claim 1,
wherein the laser oscillator is one or plural kinds selected from the group consisting of a continuous wave excimer laser, Ar laser, and Kr laser.

7. A method of manufacturing a semiconductor device as claimed in claim 1,
wherein the laser light is second harmonic.

8. A method of manufacturing a semiconductor device as claimed in claim 1,
wherein the speed of moving the center of the rotation is kept constant.

9. A method of manufacturing a semiconductor device as claimed in claim 1,
wherein the angular velocity of the rotation is increased as the distance between the center of the rotation and the certain region narrows.

10. A method of manufacturing a semiconductor device as claimed in claim 1,
wherein an incident angle $\Phi$ of the laser light with respect to a plane formed by the rotation satisfies $\Phi \geq \arctan(W/2d)$ when the width of the laser light at the nodal line between the laser light incident plane and the plane formed by the rotation is given as W and the thickness of a substrate having the insulating surface is given as d.

* * * * *

UNITED STATES PATENT AND TRADEMARK OFFICE
CERTIFICATE OF CORRECTION

PATENT NO. : 7,589,032 B2
APPLICATION NO. : 10/237172
DATED : September 15, 2009
INVENTOR(S) : Yamazaki et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 989 days.

Signed and Sealed this

Twenty-first Day of September, 2010

David J. Kappos
*Director of the United States Patent and Trademark Office*